United States Patent
Kim

(10) Patent No.: US 9,368,178 B2
(45) Date of Patent: Jun. 14, 2016

(54) RESISTIVE MEMORY DEVICE, MEMORY SYSTEM INCLUDING THE SAME AND METHOD OF READING DATA FROM THE SAME

(71) Applicant: Samsung Electronics Co., Ltd., Suwon-Si (KR)

(72) Inventor: Chan-Kyung Kim, Hwaseong-si (KR)

(73) Assignee: SAMSUNG ELECTRONICS CO., LTD., Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 14/722,031

(22) Filed: May 26, 2015

(65) Prior Publication Data

US 2016/0027488 A1  Jan. 28, 2016

(30) Foreign Application Priority Data

Jul. 23, 2014  (KR) .................. 10-2014-0093149

(51) Int. Cl.
   *G11C 11/00*  (2006.01)
   *G11C 11/16*  (2006.01)

(52) U.S. Cl.
   CPC ........ *G11C 11/1673* (2013.01); *G11C 11/1653* (2013.01)

(58) Field of Classification Search
   CPC ..................................... G11C 11/00
   USPC ....................................... 365/148
   See application file for complete search history.

(56) References Cited

U.S. PATENT DOCUMENTS

| | | | |
|---|---|---|---|
| 6,937,535 B2 | 8/2005 | Ahn et al. | |
| 7,251,178 B2* | 7/2007 | Gogl | G11C 7/02 327/53 |
| 7,433,253 B2* | 10/2008 | Gogl | G11C 5/02 327/53 |
| 7,495,984 B2 | 2/2009 | Kim et al. | |
| 8,102,695 B2 | 1/2012 | Ono et al. | |
| 8,331,157 B2 | 12/2012 | Ozeki | |
| 8,509,003 B2 | 8/2013 | Lin et al. | |
| 8,604,827 B2 | 12/2013 | Jeong et al. | |
| 8,630,136 B2 | 1/2014 | Ueda et al. | |
| 2004/0120200 A1* | 6/2004 | Gogl | G11C 7/067 365/210.1 |
| 2006/0050584 A1* | 3/2006 | Gogl | G11C 7/02 365/207 |
| 2008/0002481 A1* | 1/2008 | Gogl | G11C 5/02 365/189.06 |
| 2008/0094874 A1* | 4/2008 | Liaw | G11C 11/16 365/148 |
| 2009/0103354 A1 | 4/2009 | Yoon et al. | |

(Continued)

*Primary Examiner* — Harry W Byrne
(74) *Attorney, Agent, or Firm* — Muir Patent Law, PLLC

(57) ABSTRACT

A resistive memory device may include first and second resistive memory cells, a reference current generator, and first and second bitline sense amplifiers. The reference current generator may be configured to apply the first and second reference currents to a first common node. A total reference current of the first reference current and the second reference current provided to the first common node may be divided into a first sensing current and a second sensing current by the first common node. The first and second sensing currents may be provided to the first and second bitline sense amplifiers by the first common node, respectively. The first and second bitline sense amplifiers may be configured to sense first data of the first resistive memory cell and second data of the second resistive memory cell based on the first and second sensing currents, respectively.

20 Claims, 27 Drawing Sheets

(56) References Cited

U.S. PATENT DOCUMENTS

| | | | |
|---|---|---|---|
| 2012/0126783 A1* | 5/2012 | Jefremow | G11C 16/28 324/76.77 |
| 2013/0148429 A1 | 6/2013 | Kim et al. | |
| 2013/0258762 A1 | 10/2013 | Chih et al. | |
| 2013/0285709 A1 | 10/2013 | Oh et al. | |
| 2014/0003129 A1 | 1/2014 | Rho | |

\* cited by examiner

RESISTIVE MEMORY DEVICE, MEMORY SYSTEM INCLUDING THE SAME AND METHOD OF READING DATA FROM THE SAME

CROSS-REFERENCE TO RELATED APPLICATION

This application claims priority under 35 USC §119 to Korean Patent Application No. 10-2014-0093149, filed on Jul. 23, 2014 in the Korean Intellectual Property Office (KIPO), the contents of which are herein incorporated by reference in their entirety.

BACKGROUND

1. Technical Field

Example embodiments relate generally to semiconductor memory devices, and more particularly to resistive memory devices, memory systems including the resistive memory devices and methods of reading data from the resistive memory devices.

2. Description of the Related Art

Due to demand for high memory capacity, high operation speed and low power consumption of the memory devices, resistive memory devices of various types have been developed in an attempt to combine the high integration rate and high speed of DRAM devices and the non-volatility of flash memory devices in a single memory device. Material used in the resistive memory devices has a resistance that is variable depending on magnitude and/or direction of applied voltage and/or current. Moreover, the resistance of the material can be maintained (that is, non-volatility) even though the applied voltage and/or current is removed, and thus a refresh operation may not be required.

The performance of the resistive memory devices may be degraded based on various factors, such as variations of manufacturing process, variations of signals applied to peripheral circuits (e.g., circuits for writing and/or reading data) in the resistive memory device, etc. It is useful to design the resistive memory devices that have a relatively low degradation due to such various factors.

SUMMARY

Accordingly, the present disclosure is provided in consideration of one or more limitations and disadvantages of the related art.

At least one example embodiment of the present disclosure provides a resistive memory device capable of having a relatively high integration degree and a relatively high data sensing performance.

At least one example embodiment of the present disclosure provides a memory system including the resistive memory device.

At least one example embodiment of the present disclosure provides a method of reading data from the resistive memory device.

According to example embodiments, a resistive memory device includes a first resistive memory cell, a second resistive memory cell, a reference current generator, a first bitline sense amplifier, and a second bitline sense amplifier. The first resistive memory cell is connected to a first bitline. The second resistive memory cell is connected to a second bitline. The reference current generator is connected to a first common node, and is configured to provide a first reference current and a second reference current to the first common node. An amount of the second reference current is different from an amount of the first reference current. The first bitline sense amplifier is connected to the first common node, and connected to the first bitline at a second node. The first bitline sense amplifier is configured to sense first data stored in the first resistive memory cell based on a first sensing current provided from the first common node. The first sensing current is generated based on the first and second reference currents. The second bitline sense amplifier is connected to the first common node, and connected to the second bitline at a third node. The second bitline sense amplifier is configured to sense second data stored in the second resistive memory cell based on a second sensing current provided from the first common node. The second sensing current is generated based on the first and second reference currents. A total reference current of the first reference current and the second reference current provided to the first common node is divided into the first sensing current and the second sensing current by the first common node.

The total reference current may be obtained by adding the second reference current to the first reference current at the first common node. An amount of the second sensing current is substantially the same as an amount of the first sensing current.

Each of the amount of the first sensing current and the amount of the second sensing current may be substantially the same as a half of an amount of the total reference current.

In an example embodiment, the first bitline sense amplifier may include a first sensing circuit and a second sensing circuit. The first sensing circuit may be connected to the first common node and the second node and may be configured to operate in response to a sensing enable signal. The second sensing circuit may be connected to the first common node and the second node, may include a first output node and a second output node and may be configured to operate in response to an inverted signal of the sensing enable signal. A first result of sensing the first data is output at the first and second output nodes.

The first sensing circuit may include a first n-type metal oxide semiconductor (NMOS) transistor, a second NMOS transistor and a third NMOS transistor. The first NMOS transistor may be connected between the first common node and the second node and may have a gate electrode receiving the sensing enable signal. The second NMOS transistor may be connected between the second node and a ground voltage and may have a gate electrode receiving the sensing enable signal. The third NMOS transistor may be connected between the first common node and the ground voltage and may have a gate electrode receiving the sensing enable signal.

The second sensing circuit may include a first p-type metal oxide semiconductor (PMOS) transistor, a second PMOS transistor, a first NMOS transistor, a third PMOS transistor and a second NMOS transistor. The first PMOS transistor may be connected between a power supply voltage and a fourth node and may have a gate electrode receiving the inverted signal of the sensing enable signal. The second PMOS transistor may be connected between the fourth node and the first output node and may have a gate electrode connected to the second output node. The first NMOS transistor may be connected between the first output node and the second node and may have a gate electrode connected to the second output node. The third PMOS transistor may be connected between the fourth node and the second output node and may have a gate electrode connected to the first output node. The second NMOS transistor may be connected between the second output node and the first common node and may have a gate electrode connected to the first output node.

In an example embodiment, the resistive memory device may further include a first column gating circuit and a second column gating circuit. The first column gating circuit may selectively connect the first output node to a first local input/output (I/O) line based on a first column selection signal. The second column gating circuit may selectively connect the second output node to a second local I/O line based on the first column selection signal.

In an example embodiment, the reference current generator may include a first reference resistive memory cell and a second reference resistive memory cell. The first reference resistive memory cell may be connected to a first reference bitline and may store first reference data having a first logic level. The second reference resistive memory cell may be connected to a second reference bitline and may store second reference data having a second logic level different from the first logic level.

The first reference bitline and the first reference resistive memory cell may be substantially symmetric to the first bitline and the first resistive memory cell with respect to the first bitline sense amplifier. The second reference bitline and the second reference resistive memory cell may be substantially symmetric to the second bitline and the second resistive memory cell with respect to the second bitline sense amplifier.

In an example embodiment, the resistive memory device may further include a third resistive memory cell, a fourth resistive memory cell, a first bitline selector, and a second bitline selector. The third resistive memory cell may be connected to a third bitline, and storing third data. The fourth resistive memory cell may be connected to a fourth bitline, and storing fourth data. The first bitline selector may selectively connect the second node to one of the first and third bitlines based on a bitline selection signal. The second bitline selector may selectively connect the third node to one of the second and fourth bitlines based on the bitline selection signal. The first bitline sense amplifier may be configured to sense the selected data of the first data and third data through the selected bitline of the first and third bitlines based on the first sensing current. The second bitline sense amplifier may be configured to sense the selected data of the second data and fourth data through the selected bitline of the second and fourth bitlines based on the second sensing current.

The first data and the second data may be substantially simultaneously sensed.

In an example embodiment, the second bitline sense amplifier may have a structure substantially the same as that of the first bitline sense amplifier.

In an example embodiment, the resistive memory device may further include a first bitline connector and a first precharge circuit. The first bitline connector may selectively connect the first bitline to the second node based on a read column selection signal. The first precharge circuit may precharge the first bitline to a source line voltage based on a precharge control signal.

In an example embodiment, the first resistive memory cell may include a first resistive element and a first cell transistor. The first resistive element may have a first terminal connected to the first bitline and a second terminal. The first cell transistor may have a first electrode connected to the second terminal of the first resistive element, a gate electrode connected to a first wordline, and a second electrode connected to a source line voltage.

The first resistive element may include a magnetic tunnel junction (MTJ) element.

In an example embodiment, the resistive memory device may further include a row decoder, a column decoder and a source line voltage generator. The row decoder may be configured to select the first and second resistive memory cells based on a row address. The column decoder may be configured to select the first and second resistive memory cells based on a column address. The source line voltage generator may be configured to provide a source line voltage to the first and second resistive memory cells.

According to example embodiments, a resistive memory device includes a memory cell array including a plurality of sub array blocks and a plurality of bitline sense amplifier blocks disposed adjacent to the plurality of sub array blocks. A respective one of the sub array blocks includes a first resistive memory cell, a second resistive memory cell and a reference current generator. The first resistive memory cell is connected to a first bitline. The second resistive memory cell is connected to a second bitline. The reference current generator is connected to a first common node and is configured to generate a first reference current and a second reference current, and to apply the first and second reference currents to the first common node. An amount of the second reference current is different from an amount of the first reference current. A respective one of the bitline sense amplifier blocks includes a first bitline sense amplifier and a second bitline sense amplifier. The first bitline sense amplifier is connected to the first common node, and is connected to the first bitline at a second node and may be configured to sense first data stored in the first resistive memory cell based on a first sensing current provided from the first common node. The first sensing current is generated based on the first and second reference currents. The second bitline sense amplifier is connected to the first common node, and is connected to the second bitline at a third node and may be configured to sense second data stored in the second resistive memory cell based on a second sensing current provided from the first common node. The second sensing current is generated based on the first and second reference currents. A total reference current of the first reference current and the second reference current provided to the first common node is divided into the first sensing current and the second sensing current by the first common node.

The total reference current may be obtained by adding the second reference current to the first reference current at the first common node. Each of the amount of the first sensing current and the amount of the second sensing current may be substantially the same as a half of an amount of the total reference current.

In an example embodiment, the resistive memory device may include at least one selected from a magnetic random access memory (MRAM), a resistive random access memory (RRAM), a phase change random access memory (PRAM) and a ferroelectric random access memory (FRAM).

In an example embodiment, each of the first resistive memory cell and the second resistive memory cell may include a spin-transfer torque magneto-resistive random access memory (STT-MRAM) cell that includes a magnetic tunnel junction (MTJ) element and a cell transistor.

According to example embodiments, a memory system includes a memory controller and a resistive memory device controlled by the memory controller. The resistive memory device includes a first resistive memory cell, a second resistive memory cell, a reference current generator, a first bitline sense amplifier, and a second bitline sense amplifier. The first resistive memory cell is connected to a first bitline. The second resistive memory cell is connected to a second bitline. The reference current generator is connected to a first common node, and is configured to provide a first reference current and a second reference current to the first common node. An amount of the second reference current is different from an amount of the first reference current. The first bitline sense amplifier is connected to the first common node, and is connected to the first bitline at a second node and may be configured to sense first data stored in the first resistive memory cell based on a first sensing current provided from the first common node. The first sensing current is generated based on the first and second reference currents. The second bitline sense amplifier is connected to the first common node, and is connected to the second bitline at a third node and senses second data stored in the second resistive memory cell based on a second sensing current provided from the first common node. The second sensing current is generated based on the first and second reference currents. An amount of the second sensing current is substantially the same as an amount of the first sensing current.

According to example embodiments, a method of performing a read operation for a resistive memory device including a first resistive memory cell connected to a first bitline sense amplifier and a second resistive memory cell connected to a second bitline sense amplifier is provided. The method includes: generating a first reference current based on a first reference resistive memory cell; generating a second reference current based on a second reference resistive memory cell; providing a total reference current of the first reference current and the second reference current to a first common node; dividing the total reference current into a first sensing current and a second sensing current by the first common node; providing a first sensing current and a second sensing current to a first bitline sense amplifier and a second bitline sense amplifier, respectively; and substantially simultaneously sensing first data of the first resistive memory cell and second data of the second resistive memory cell based on the first and second sensing currents, respectively.

An amount of the second reference current may be different from an amount of the first reference current, and an amount of the second sensing current may be substantially the same as an amount of the first sensing current.

In an example embodiment, the second bitline sense amplifier may have a structure substantially the same as that of the first bitline sense amplifier and may be connected to the first bitline sense amplifier at the first common node. The first reference resistive memory cell may be substantially symmetric to the first resistive memory cell with respect to the first bitline sense amplifier. The second reference resistive memory cell may be substantially symmetric to the second resistive memory cell with respect to the second bitline sense amplifier.

In substantially simultaneously sensing the first and second data, a first bitline and a second bitline may be precharged to a source line voltage based on a precharge control signal. The first bitline may be connected to the first resistive memory cell. The second bitline may be connected to the second resistive memory cell. The first and second resistive memory cells may be selected by enabling a first wordline connected to the first and second resistive memory cells. The first and second sensing currents may be provided to the first and second bitline sense amplifiers based on a read column selection signal. The first data may be sensed, by the first bitline sense amplifier, based on a sensing enable signal and the first sensing current to output a first result of sensing the first data. The second data may be sensed, by the second bitline sense amplifier, based on the sensing enable signal and the second sensing current to output a second result of sensing the second data. The first result and the second result may be substantially simultaneously output.

According to example embodiments, a resistive memory device includes: a first resistive memory cell connected to a first bitline; a second resistive memory cell connected to a second bitline; a first bitline sense amplifier connected to a first common node and connected to the first bitline at a second node, and the first bitline sense amplifier configured to sense first data of the first resistive memory cell based on a first sensing current provided to the first common node; a second bitline sense amplifier connected to the first common node and connected to the second bitline at a third node, and the second bitline sense amplifier configured to sense second data of the second resistive memory cell based on a second sensing current provided to the first common node; and a reference current generator configured to provide the first reference current and the second reference current to the first common node. The first bitline sense amplifier and the second bitline sense amplifier are directly connected to the first common node, respectively.

The resistive memory device according to example embodiments may include two bitline sense amplifiers that have the substantially same structure. A pair of the reference bitlines and a pair of the reference resistive memory cells that store different reference data may be shared by two bitline sense amplifiers. The reference currents generated from the reference resistive memory cells may be sum up at the first common node to generate the total reference current, and the total reference current may be divided at the first common node to generate the sensing currents. Thus, the resistive memory device may efficiently generate the sensing currents that have the substantially same amount without any additional circuit. Accordingly, the resistive memory device may have a relatively high integration degree and a relatively high data sensing performance.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
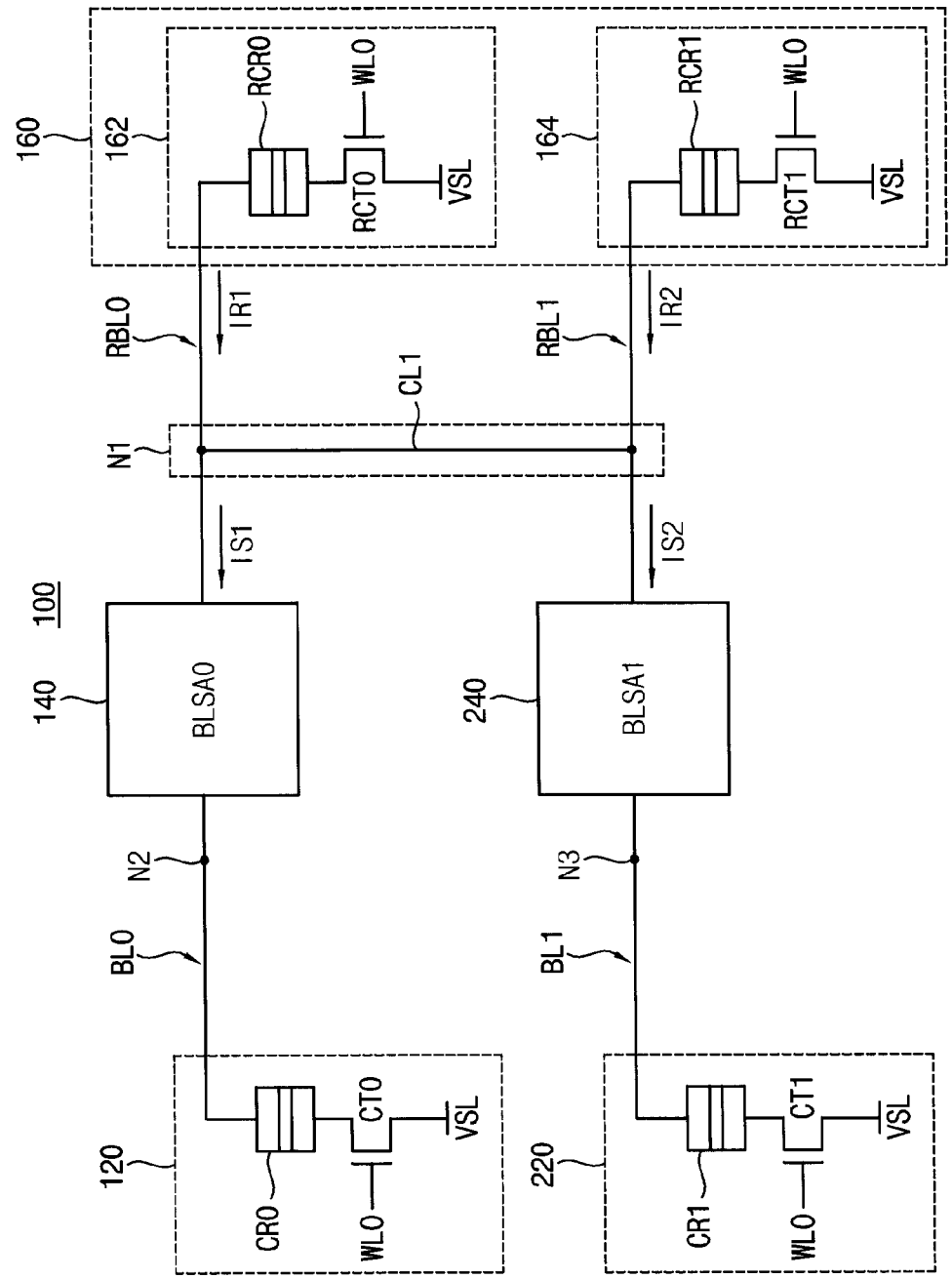
FIG. 1 is a block diagram illustrating a resistive memory device according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

It will be understood that, although the terms first, second, etc. may be used herein to describe various elements, these elements should not be limited by these terms. Unless indicated otherwise, these terms are used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the present disclosure. As used herein, the singular forms "a," "an" and "the" are intended to include the plural forms as well, unless the context clearly indicates otherwise. Expressions such as "at least one of," when preceding a list of elements, modify the entire list of elements and do not modify the individual elements of the list. It will be further understood that the terms "comprises," "comprising," "includes" and/or "including," when used herein, specify the presence of stated features, integers, steps, operations, elements, and/or components, but do not preclude the presence or addition of one or more other.

Unless the context indicates otherwise, terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a resistive memory device according to example embodiments.

Referring to FIG. 1, a resistive memory device 100 includes a first resistive memory cell 120, a second resistive memory cell 220, a reference current generator 160, a first bitline sense amplifier 140, and a second bitline sense amplifier 240.

As used herein, a resistive memory device may refer to various items such as a semiconductor memory device, a memory device, memory cells formed in or on a semiconductor substrate, a semiconductor chip, a memory chip, a resistive memory chip, a package, or combinations thereof. A resistive memory device such as a semiconductor chip, a memory chip, or a resistive memory chip may be formed from a wafer. A resistive memory device may comprise a package which may include one or more chips stacked on a package substrate, or a package-on-package device including a plurality of packages. A resistive memory device may include an array of resistive memory cells.

An electronic device, as used herein, may refer to one of these devices and may also include products that include these devices, such as a memory module, a hard drive including additional components, a mobile phone, laptop, tablet, desktop, camera, server, computing system, or other consumer electronic device, etc.

The first resistive memory cell 120 is connected to a first bitline BL0. The first resistive memory cell 120 may store first data. The first resistive memory cell 120 may include a first resistive element CR0 and a first cell transistor CT0. The first resistive element CR0 may have a first terminal and a second terminal, and the first terminal of the first resistive element CR0 may be connected to the first bitline BL0. The first cell transistor CT0 may have a first electrode (e.g., a source electrode) connected to the second terminal of the first resistive element CR0, a gate electrode connected to a first wordline WL0, and a second electrode (e.g., a drain electrode) connected to a source line voltage VSL. For example, a voltage level of the source line voltage VSL may be a half of a power supply voltage VDD or may be the same as the power supply voltage VDD.

The second resistive memory cell 220 is connected to a second bitline BL1. The second resistive memory cell 220 may store second data. The second resistive memory cell 220 may include a second resistive element CR1 and a second cell transistor CT1. The second resistive element CR1 may have a first terminal and a second terminal, and the first terminal of the second resistive element CR1 may be connected to the second bitline BL1. The second cell transistor CT1 may have a first electrode connected to the second terminal of the second resistive element CR1, a gate electrode connected to the first wordline WL0, and a second electrode connected to the source line voltage VSL.

The reference current generator 160 is connected to a first common node N1. In one embodiment, the reference current generator 160 is configured to generate a first reference current IR1 and a second reference current IR2. The reference current generator 160 is also configured to apply the first and second reference currents IR1 and IR2 to the first common node N1. An amount of the second reference current IR2 may be different from an amount of the first reference current IR1.

The reference current generator 160 may include a first reference resistive memory cell 162 and a second reference resistive memory cell 164. The first reference resistive memory cell 162 may be connected to a first reference bitline RBL0 and may store first reference data having a first logic level. The second reference resistive memory cell 164 may be connected to a second reference bitline RBL1 and may store second reference data having a second logic level. The second logic level may be different from, or opposite to the first logic level. For example, the first logic level may correspond to a logic high level (e.g., '1'), and the second logic level may correspond to a logic low level (e.g., '0'). When the first logic level corresponds to the logic high level and the second logic level corresponds to the logic low level, the amount of the first reference current IR1 may be smaller than the amount of the second reference current IR2.

The first reference resistive memory cell 162 may include a first reference resistive element RCR0 and a first reference cell transistor RCT0. The first reference resistive element RCR0 may have a first terminal and a second terminal, and the first terminal of the first reference resistive element RCR0 may be connected to the first reference bitline RBL0. The first reference cell transistor RCT0 may have a first electrode connected to the second terminal of the first reference resistive element RCR0, a gate electrode connected to the first wordline WL0, and a second electrode connected to the source line voltage VSL. The gate electrode of the first reference cell transistor RCT0 may be connected to a first reference wordline RWL0 having the same voltage level as the first wordline WL0.

The second reference resistive memory cell 164 may include a second reference resistive element RCR1 and a second reference cell transistor RCT1. The second reference resistive element RCR1 may have a first terminal and a second terminal, and the first terminal of the second reference resistive element RCR1 may be connected to the second reference bitline RBL1. The second reference cell transistor RCT1 may have a first electrode connected to the second terminal of the second reference resistive element RCR1, a gate electrode connected to the first wordline WL0, and a second electrode connected to the source line voltage VSL. The gate electrode of the second reference cell transistor RCT1 may be connected to the first reference wordline RWL0.

In some example embodiments, each of the first and second resistive elements CR0 and CR1, and the first and second reference resistive elements RCR0 and RCR1 may include a magnetic tunnel junction (MTJ) element. In some example embodiments, each of the first and second resistive memory cell 120 and 220 and the first and second reference resistive memory cell 162 and 164 may include a spin-transfer torque magneto-resistive random access memory (STT-MRAM) cell that includes a MTJ element and a cell transistor. Detailed configurations and operations of the resistive memory cells 120, 140, 162 and 164 will be described in detail with reference to FIGS. 7A, 7B, 7C, 7D, 8A, 8B, 9, 10A, 10B, 10C, 10D, 10E, 10F, 10G and 10H.

The first bitline sense amplifier 140 is connected to the first common node N1 and is connected to the first bitline BL0 at a second node N2. In one embodiment, the first bitline sense amplifier 140 is configured to sense the first data stored in the first resistive memory cell 120 based on a first sensing current IS1. The first sensing current IS1 that is generated based on the first and second reference currents IR1 and IR2 and is provided by the first common node N1 is provided to the first bitline sense amplifier 140.

The second bitline sense amplifier 240 is connected to the first common node N1 and is connected to the second bitline BL1 at a third node N3. In one embodiment, the second bitline sense amplifier 240 is configured to sense the second data stored in the second resistive memory cell 220 based on a second sensing current IS2. The second sensing current IS2 that is generated based on the first and second reference currents IR1 and IR2 and is provided by the first common node N1 is provided to the second bitline sense amplifier 240. In one embodiment, the amount of the second sensing current IS2 is substantially the same as the amount of the first sensing current IS1.

In one embodiment, the first bitline sense amplifier 140 and the second bitline sense amplifier 240 may directly connect through the first common node N1. For example, a first conductive line CL1 may connect a node of the first bitline sense amplifier 140 to a node of the second bitline sense amplifier 240. In one embodiment, the first common node N1 including the first conductive line CL1 does not include any element (e.g., a passive element or a active element) other than, for example, conductive material (i.e., a conductive line) for transmitting current. Therefore, the first bitline sense amplifier 140 may directly electrically connect to the second bitline sense amplifier 240 through the first common node N1. Though the first common node N1 is shown using a dotted line in FIG. 1, the node is not limited to the specification indicated by the dotted line.

As illustrated in FIG. 1, the first reference bitline RBL0 and the first reference resistive memory cell 162 may be substantially symmetric to the first bitline BL0 and the first resistive memory cell 120, respectively, with respect to the first bitline sense amplifier 140. The second reference bitline RBL1 and the second reference resistive memory cell 164 may be substantially symmetric to the second bitline BL1 and the second resistive memory cell 220, respectively, with respect to the second bitline sense amplifier 240.

In some example embodiments, a total reference current may be obtained by adding the second reference current IR2 to the first reference current IR1 at the first common node N1. The first and second sensing currents IS1 and IS2 may be generated by dividing (e.g., shunting) the total reference current into the first and second sensing currents IS1 and IS2 based on a first load and a second load. The first load may be based on the first resistive memory cell 120 and the first bitline sense amplifier 140, and the second load may be based on the second resistive memory cell 220 and the second bitline sense amplifier 240. As illustrated in FIG. 1, the second resistive memory cell 220 may have a structure substantially the same as that of the first resistive memory cell 120. In addition, as will be described below with reference to FIG. 2, the second bitline sense amplifier 240 may have a structure substantially the same as that of the first bitline sense amplifier 140. Therefore, the first load may be substantially the same as the second load, and thus the amount of the first sensing current IS1 may be substantially the same as the amount of the second sensing current IS2.

In some example embodiments, when the amount of the first sensing current IS1 is substantially the same as the amount of the second sensing current IS2, each of the amount of the first sensing current IS1 and the amount of the second sensing current IS2 may be substantially the same as a half of the amount of the total reference current. For example, the first sensing current IS1 and the second sensing current IS2 may be represented by Equation 1.

$$IS1=IS2=(IR1+IR2)/2 \qquad \text{[Equation 1]}$$

In some example embodiments, the first and second sensing currents IS1 and IS2 may be substantially simultaneously generated, and thus the first and second data may be substantially simultaneously sensed.

The resistive memory device 100 according to example embodiments may include two bitline sense amplifiers 140 and 240 that are directly connected to the first common node N1 and have the substantially same structure. A pair of the reference bitlines RBL0 and RBL1 and a pair of the reference resistive memory cells 162 and 164 that store different reference data may be shared by two bitline sense amplifiers 140 and 240. The reference currents IR1 and IR2 generated from the reference resistive memory cells 162 and 164 may be summed up at the first common node N1 to generate the total reference current, and the total reference current may be divided by the first common node N1 to generate the sensing currents IS1 and IS2. Thus, the resistive memory device 100 may efficiently generate the sensing currents IS1 and IS2 that have the substantially same amount (e.g., magnitude or level) without any additional circuit (e.g., a current mirror) or any additional element (e.g., a passive element or a active element). Accordingly, the resistive memory device 100 may have a relatively high integration degree and a relatively high data sensing performance.

Figure 2:
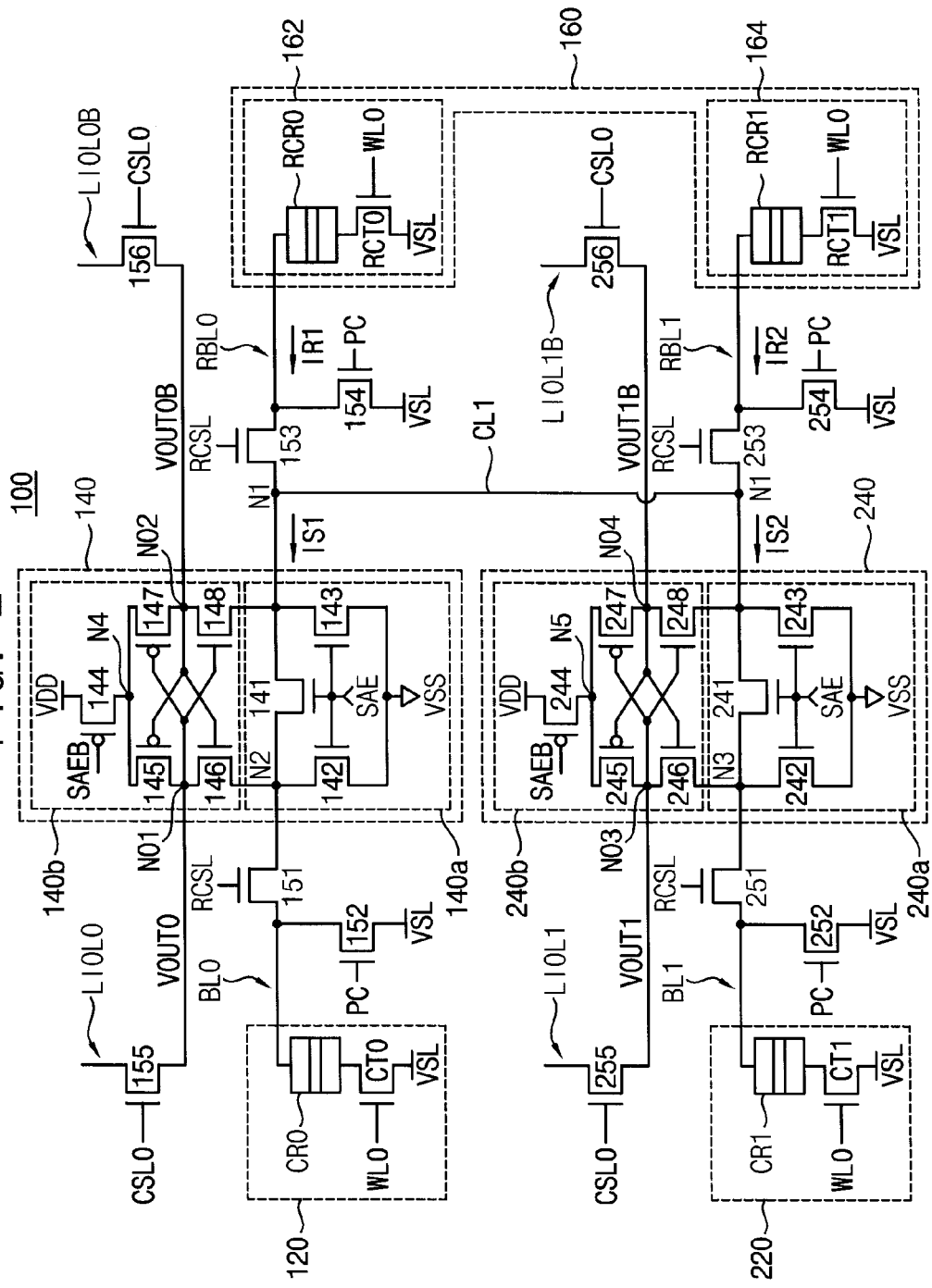
FIG. 2 is a circuit diagram illustrating the resistive memory device of FIG. 1 according to example embodiments.

FIG. 2 is a circuit diagram illustrating the resistive memory device of FIG. 1 according to example embodiments.

Referring to FIG. 2, a resistive memory device 100 includes a first resistive memory cell 120, a second resistive memory cell 220, a reference current generator 160, a first bitline sense amplifier 140, and a second bitline sense amplifier 240. The resistive memory device 100 may further include first through fourth bitline connectors 151, 153, 251 and 253, first through fourth precharge circuits 152, 154, 252 and 254, and first through fourth column gating circuits 155, 156, 255 and 256.

As described above with reference to FIG. 1, each of the first and second resistive memory cells 120 and 220 may include a respective one of the first and second resistive elements CR0 and CR1 and a respective one of the first and second cell transistors CT0 and CT1. The reference current generator 160 may include the first and second reference resistive memory cells 162 and 164. Each of the first and second reference resistive memory cells 162 and 164 may include a respective one of the first and second reference resistive elements RCR0 and RCR1 and a respective one of the first and second reference cell transistors RCT0 and RCT1.

The first bitline sense amplifier 140 may include a first sensing circuit 140a and a second sensing circuit 140b. The first sensing circuit 140a may be connected to the first common node N1 and the second node N2. The first sensing circuit 140a may be configured to operate in response to a sensing enable signal SAE. The second sensing circuit 140b may be connected to the first common node N1 and the second node N2. The second sensing circuit 140b may be configured to operate in response to an inverted signal SAEB of the sensing enable signal SAE. The second sensing circuit 140b may include a first output node NO1 and a second output node NO2 that output a first result of sensing the first data (e.g., first output voltages VOUT0/VOUT0B). For example, the second sensing circuit 140b may have a cross-coupled latch structure.

The first sensing circuit 140a may include a first n-type metal oxide semiconductor (NMOS) transistor 141, a second NMOS transistor 142 and a third NMOS transistor 143. The first NMOS transistor 141 may be connected between the first common node N1 and the second node N2 and may have a gate electrode receiving the sensing enable signal SAE. The second NMOS transistor 142 may be connected between the second node N2 and a ground voltage VSS and may have a gate electrode receiving the sensing enable signal SAE. The third NMOS transistor 143 may be connected between the first common node N1 and the ground voltage VSS and may have a gate electrode receiving the sensing enable signal SAE.

The second sensing circuit 140b may include a first p-type metal oxide semiconductor (PMOS) transistor 144, a second PMOS transistor 145, a fourth NMOS transistor 146, a third PMOS transistor 147 and a fifth NMOS transistor 148. The first PMOS transistor 144 may be connected between a power supply voltage VDD and a fourth node N4 and may have a gate electrode receiving the inverted signal SAEB of the sensing enable signal SAE. The second PMOS transistor 145 may be connected between the fourth node N4 and the first output node NO1 and may have a gate electrode connected to the second output node NO2. The fourth NMOS transistor 146 may be connected between the first output node NO1 and the second node N2 and may have a gate electrode connected to the second output node NO2. The third PMOS transistor 147 may be connected between the fourth node N4 and the second output node NO2 and may have a gate electrode connected to the first output node NO1. The fifth NMOS transistor 148 may be connected between the second output node NO2 and the first common node N1 and may have a gate electrode connected to the first output node NO1.

The second bitline sense amplifier 240 may have a structure substantially the same as that of the first bitline sense amplifier 140. For example, the second bitline sense amplifier 240 may include a third sensing circuit 240a and a fourth sensing circuit 240b. The third sensing circuit 240a may be connected to the first common node N1 and the third node N3. The third sensing circuit 240a may be configured to operate in response to the sensing enable signal SAE. The fourth sensing circuit 240b may be connected to the first common node N1 and the third node N3. The fourth sensing circuit 240b may be configured to operate in response to the inverted signal SAEB of the sensing enable signal SAE. The fourth sensing circuit 240b may include a third output node NO3 and a fourth output node NO4 that output a second result of sensing the second data (e.g., second output voltages VOUT1/VOUT1B).

The third sensing circuit 240a may include a sixth NMOS transistor 241, a seventh NMOS transistor 242 and a eighth NMOS transistor 243. The sixth NMOS transistor 241 may be connected between the first common node N1 and the third node N3 and may have a gate electrode receiving the sensing enable signal SAE. The nth NMOS transistor 242 may be connected between the third node N3 and the ground voltage VSS and may have a gate electrode receiving the sensing enable signal SAE. The eighth NMOS transistor 243 may be connected between the first common node N1 and the ground voltage VSS and may have a gate electrode receiving the sensing enable signal SAE.

The fourth sensing circuit 240b may include a fourth PMOS transistor 244, a fifth PMOS transistor 245, a ninth NMOS transistor 246, a sixth PMOS transistor 247 and a tenth NMOS transistor 248. The fourth PMOS transistor 244 may be connected between the power supply voltage VDD and a fifth node N5 and may have a gate electrode receiving the inverted signal SAEB of the sensing enable signal SAE. The fifth PMOS transistor 245 may be connected between the fifth node N5 and the third output node NO3 and may have a gate electrode connected to the fourth output node NO4. The ninth NMOS transistor 246 may be connected between the third output node NO3 and the third node N3 and may have a gate electrode connected to the fourth output node NO4. The sixth PMOS transistor 247 may be connected between the fifth node N5 and the fourth output node NO4 and may have a gate electrode connected to the third output node NO3. The tenth NMOS transistor 248 may be connected between the fourth output node NO4 and the first common node N1 and may have a gate electrode connected to the third output node NO3.

The first bitline connector 151 may selectively connect the first bitline BL0 to the second node N2 based on a read column selection signal RCSL. The second bitline connector 153 may selectively connect the first reference bitline RBL0 to the first common node N1 based on the read column selection signal RCSL. The third bitline connector 251 may selectively connect the second bitline BL1 to the third node N3 based on the read column selection signal RCSL. The fourth bitline connector 253 may selectively connect the second reference bitline RBL1 to the first common node N1 based on the read column selection signal RCSL.

The first precharge circuit 152 may precharge the first bitline BL0 to the source line voltage VSL based on a precharge control signal PC. The precharge control signal PC may have the same as or a higher voltage than the power supply voltage VDD. The second precharge circuit 154 may precharge the first reference bitline RBL0 to the source line voltage VSL based on the precharge control signal PC. The third precharge circuit 252 may precharge the second bitline BL1 to the source line voltage VSL based on the precharge control signal PC. The fourth precharge circuit 254 may precharge the second reference bitline RBL1 to the source line voltage VSL based on the precharge control signal PC.

The first column gating circuit 155 may selectively connect the first output node NO1 to a first local input/output (I/O) line LIOL0 based on a first column selection signal CSL0. The second column gating circuit 156 may selectively connect the second output node NO2 to a second local I/O line LIOL0B based on the first column selection signal CSL0. The third column gating circuit 255 may selectively connect the third output node NO3 to a third local I/O line LIOL1 based on the first column selection signal CSL0. The fourth column gating circuit 256 may selectively connect the fourth output node NO4 to a fourth local I/O line LIOL1B based on the first column selection signal CSL0.

In one embodiment, the first sensing circuit 140a and the second sensing circuit 140b of the first bitline sense amplifier 140 may be directly connected to the third sensing circuit 240a and the fourth sensing circuit 240b of the second bitline sense amplifier 240 through the first common node N1. The first common node N1 may include the first conductive line CL1. For example, the first conductive line CL1 may be disposed by a metal layer, for example, titanium (Ti), platinum (Pt), tantalum (Ta), tungsten (W), copper (Cu), or aluminum (Al) etc., or a polysilicon layer or a doped polysilicon layer.

In some example embodiments, each of the first through fourth bitline connectors 151, 153, 251 and 253, the first through fourth precharge circuits 152, 154, 252 and 254, and the first through fourth column gating circuits 155, 156, 255 and 256 may include one NMOS transistor.

In some example embodiments, when the resistive memory device 100 of FIG. 2 performs a data sensing operation, the first reference bitlines RBL0 may operate as a complementary bitline of the first bitline BL0, the second reference bitlines RBL1 may operate as a complementary bitline of the second bitline BL1, the second local I/O line LIOL0B may operate as a complementary local I/O line of the first local I/O line LIOL0, and the fourth local I/O line LIOL1B may operate as a complementary local I/O line of the third local I/O line LIOL1.

Figure 3:
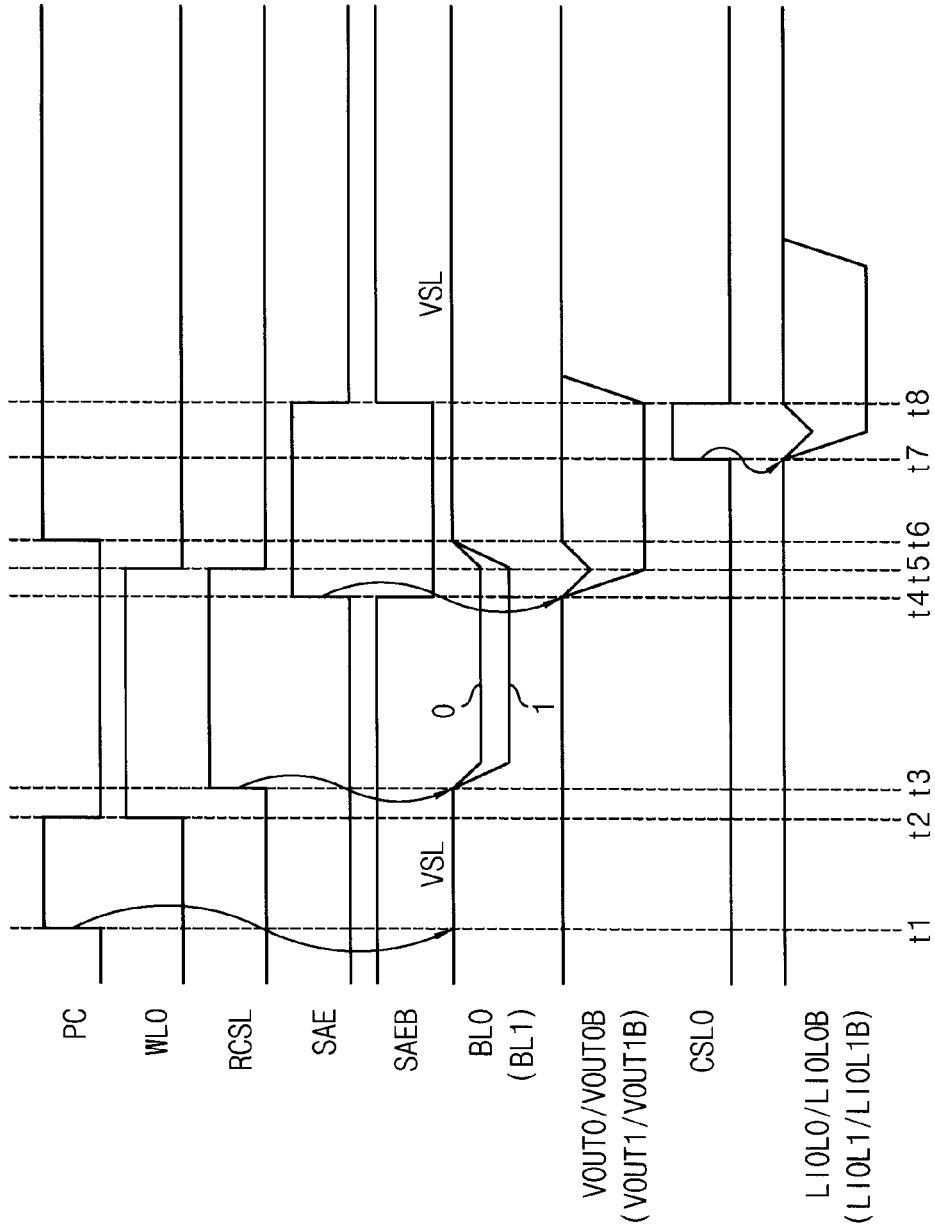
FIGS. 3 and 4 are diagrams for describing an operation of the resistive memory device of FIG. 2 according to example embodiments.
Figure 4:
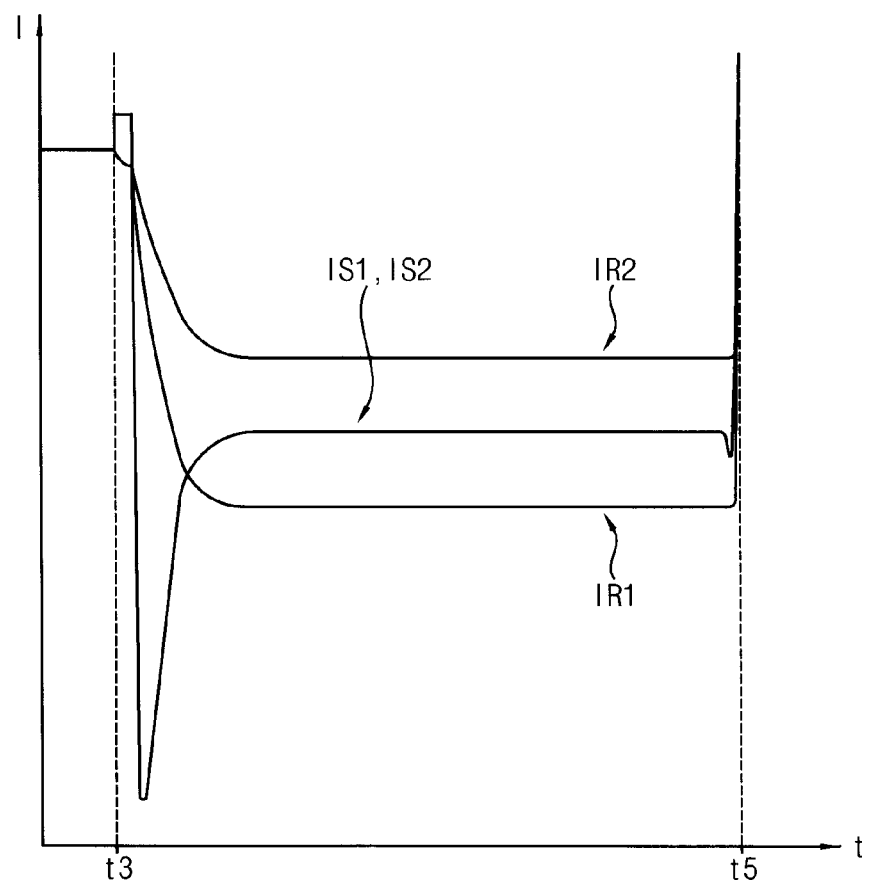

FIGS. 3 and 4 are diagrams for describing an operation of the resistive memory device of FIG. 2 according to example embodiments.

Referring to FIGS. 2 and 3, at time t1, the precharge control signal PC is activated. The first and second bitlines BL0 and BL1 are precharged to the source line voltage VSL based on the activated precharge control signal PC. Although not illustrated in FIG. 3, the first and second reference bitlines RBL0 and RBL1 may also be precharged to the source line voltage VSL based on the activated precharge control signal PC.

At time t2, the precharge control signal PC is deactivated, and the first wordline WL0 is enabled. The first and second resistive memory cells 120 and 220 are selected based on the enabled first wordline WL0. In addition, the first and second reference resistive memory cells 162 and 164 may also be selected based on the enabled first wordline WL0.

At time t3, the read column selection signal RCSL is activated. Based on the activated read column selection signal RCSL, the first and second reference bitlines RBL0 and RBL1 are connected to the first common node N1, the first bitline BL0 is connected to the second node N2, and the second bitline BL1 is connected to the third node N3. The first and second reference currents IR1 and IR2 are generated based on the first and second reference data that are stored in the first and second reference resistive memory cells 162 and 164. The first and second sensing currents IS1 and IS2 are generated based on the first and second reference currents IR1 and IR2, and then the first and second sensing currents IS1 and IS2 are provided to the first and second bitline sense amplifiers 140 and 240.

In addition, at time t3, voltage levels on the first and second bitlines BL0 and BL1 are changed depending on logic levels of the first and second data that are stored in the first and second resistive memory cells 120 and 220. For example, when the first data has the first logic level (e.g., '1'), the voltage level of the first bitline BL0 may be changed to be a relatively low voltage level compared to first reference bitlines RBL0. When the first data has the second logic level (e.g., '0'), the voltage level of the first bitline BL0 may be changed to be a relatively high voltage level compared to first reference bitlines RBL0. For example, at time t3, a voltage level of the first common node N1 may be the same as a voltage level of the second node N2 by a bitline sense amplifier precharge circuit (not shown).

At time t4, the sensing enable signal SAE is activated. The first and second bitline sense amplifiers 140 and 240 substantially simultaneously sense the first and second data based on the activated sensing enable signal SAE and the first and second sensing currents IS1 and IS2. Thus, the first result of sensing the first data (e.g., first output voltages VOUT0/VOUT0B) and the second result of sensing the second data (e.g., second output voltages VOUT1/VOUT1B) are substantially simultaneously generated.

At time t5, the first wordline WL0 is disabled, and the read column selection signal RCSL is deactivated. At time t6, the precharge control signal PC is activated again, and then the first and second bitlines BL0 and BL1 are precharged to the source line voltage VSL again.

At time t7, the first column selection signal CSL0 is activated. The first result of sensing the first data (e.g., first output voltages VOUT0/VOUT0B) and the second result of sensing the second data (e.g., second output voltages VOUT1/VOUT1B) are substantially simultaneously output to the pairs of local I/O lines LIOL0/LIOL0B and LIOL1/LIOL1B based on the activated first column selection signal CSL0. At time t8, the first column selection signal CSL0 is deactivated, and the sensing enable signal SAE is deactivated.

Referring to FIGS. 3 and 4, it may be ascertained that each of the amount of the first sensing current IS1 and the amount of the second sensing current IS2 is substantially the same as a half of the sum of the amount of the first and second reference currents IR1 and IR2. For example, the amount of the first reference current IR1 corresponding to the first logic level (e.g., '1') may be about 3.2 uA, the amount of the second reference current IR2 corresponding to the second logic level (e.g., '0') may be about 5.0 uA, and each of the amount of the first sensing current IS1 and the amount of the second sensing current IS2 may be about 4.1 uA.

Figure 5:
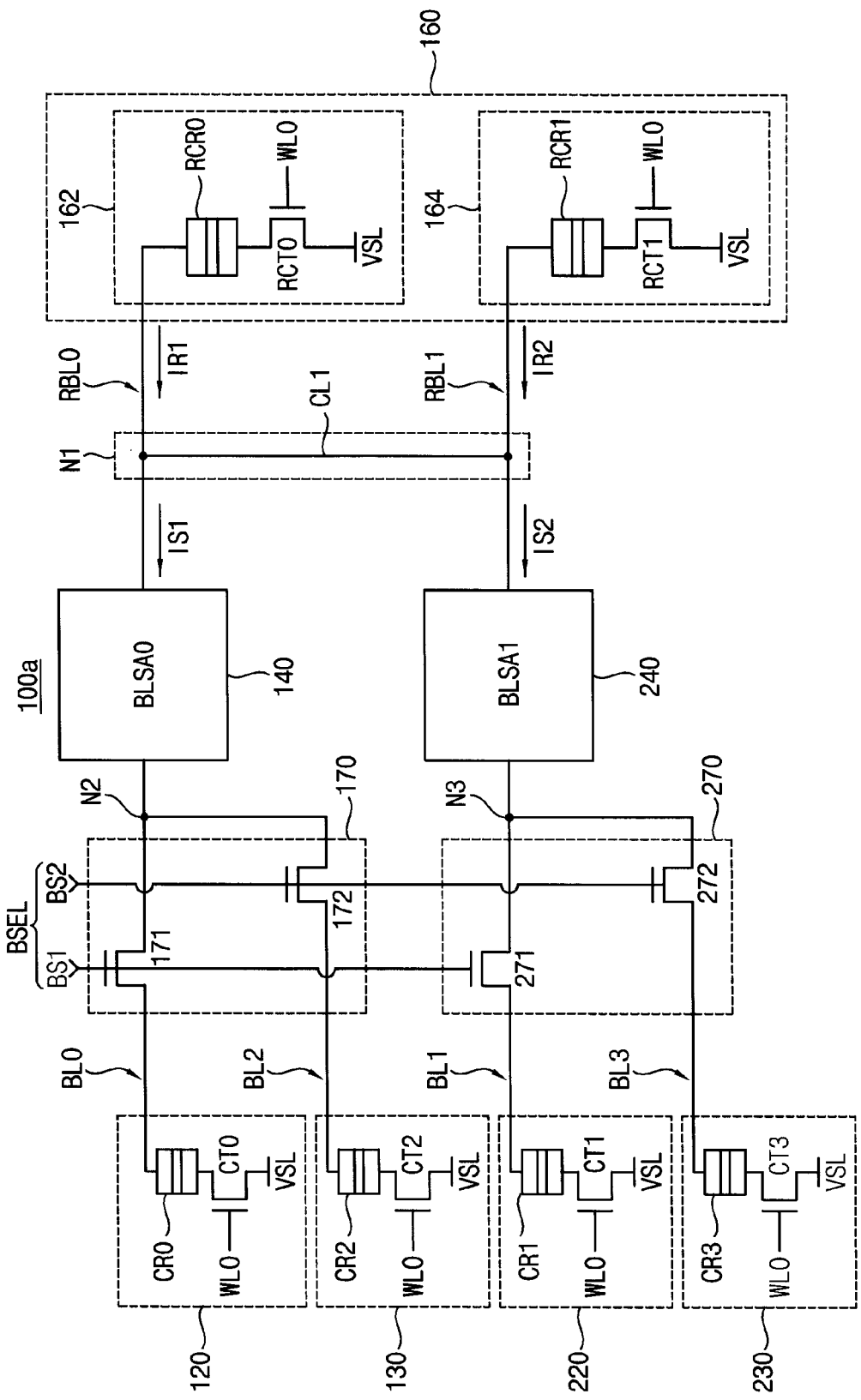
FIGS. 5 and 6 are block diagrams illustrating a resistive memory device according to example embodiments.
Figure 6:
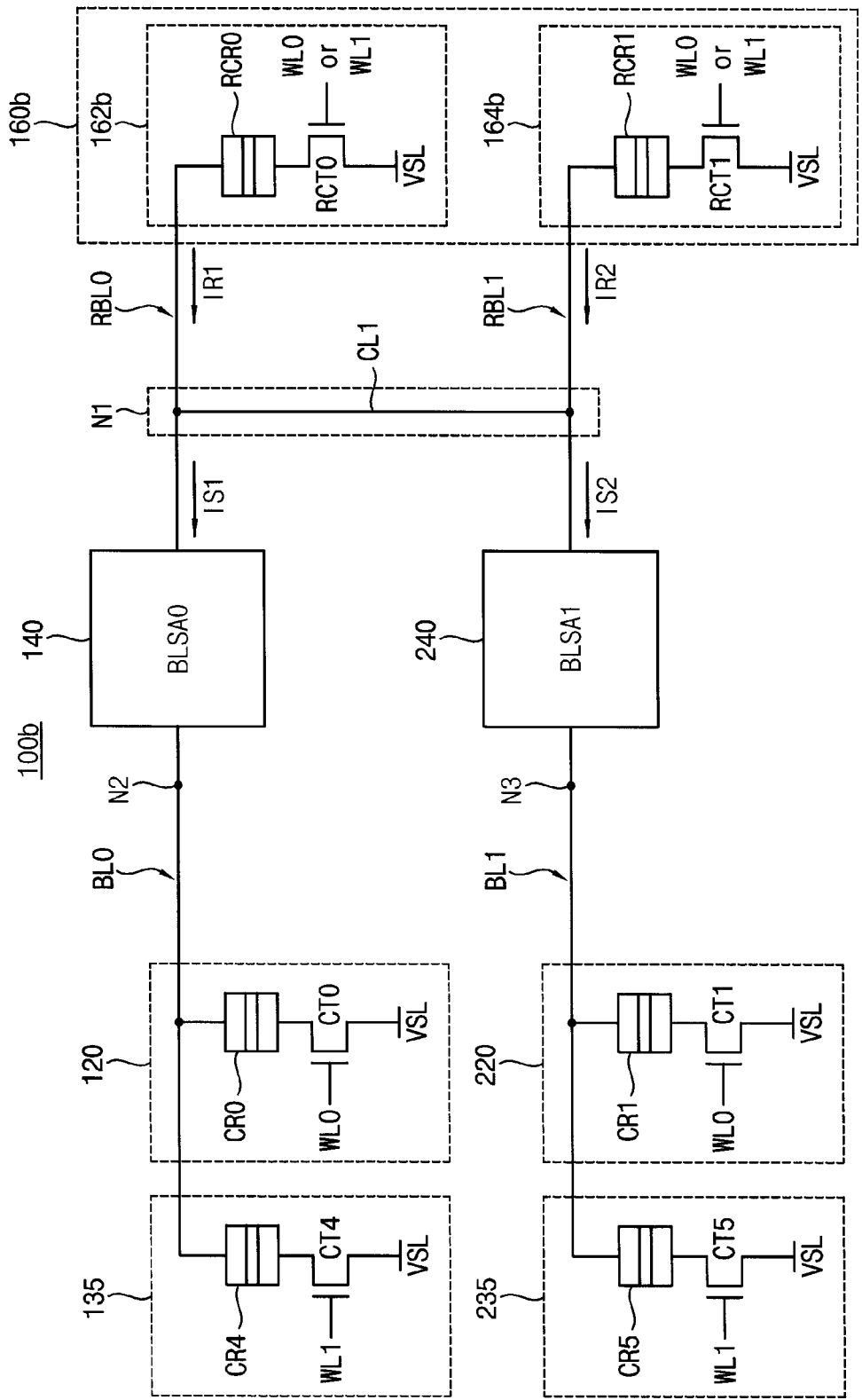

FIGS. 5 and 6 are block diagrams illustrating a resistive memory device according to example embodiments.

Referring to FIG. 5, a resistive memory device 100a includes a first resistive memory cell 120, a second resistive memory cell 220, a reference current generator 160, a first bitline sense amplifier 140 and a second bitline sense amplifier 240. The resistive memory device 100a may further include a third resistive memory cell 130, a fourth resistive memory cell 230, a first bitline selector 170 and a second bitline selector 270.

The first resistive memory cell 120, the second resistive memory cell 220, the reference current generator 160, the first bitline sense amplifier 140 and the second bitline sense amplifier 240 in FIG. 5 may be substantially the same as the first resistive memory cell 120, the second resistive memory cell 220, the reference current generator 160, the first bitline sense amplifier 140 and the second bitline sense amplifier 240 in FIG. 1, respectively.

The third resistive memory cell 130 may be connected to a third bitline BL2. The third resistive memory cell 130 may store third data. The third resistive memory cell 130 may include a third resistive element CR2 and a third cell transistor CT2. The third resistive element CR2 may have a first terminal and a second terminal, and the first terminal of the third resistive element CR2 may be connected to the third bitline BL2. The third cell transistor CT2 may have a first electrode connected to the second terminal of the third resistive element CR2, a gate electrode connected to the first wordline WL0, and a second electrode connected to the source line voltage VSL.

The fourth resistive memory cell 230 may be connected to a fourth bitline BL3. The fourth resistive memory cell 230 may store fourth data. The fourth resistive memory cell 230 may include a fourth resistive element CR3 and a fourth cell transistor CT3. The fourth resistive element CR3 may have a first terminal and a second terminal, and the first terminal of the fourth resistive element CR3 may be connected to the fourth bitline BL3. The fourth cell transistor CT3 may have a first electrode connected to the second terminal of the fourth resistive element CR3, a gate electrode connected to the first wordline WL0, and a second electrode connected to the source line voltage VSL.

The first bitline selector 170 may selectively connect the second node N2 to one of the first and third bitlines BL0 and BL2 based on a bitline selection signal BSEL. The first bitline selector 170 may include NMOS transistors 171 and 172. The NMOS transistor 171 may be connected between the first bitline BL0 and the second node N2 and may have a gate electrode receiving a first bit BS1 of the bitline selection signal BSEL. The NMOS transistor 172 may be connected between the third bitline BL2 and the second node N2 and may have a gate electrode receiving a second bit BS2 of the bitline selection signal BSEL.

The second bitline selector 270 may selectively connect the third node N3 with one of the second and fourth bitlines BL1 and BL3 based on the bitline selection signal BSEL. The second bitline selector 270 may include NMOS transistors 271 and 272. The NMOS transistor 271 may be connected between the second bitline BL1 and the third node N3 and may have a gate electrode receiving the first bit BS1 of the bitline selection signal BSEL. The NMOS transistor 272 may be connected between the fourth bitline BL3 and the third node N3 and may have a gate electrode receiving the second bit BS2 of the bitline selection signal BSEL.

The first bitline sense amplifier 140 may selectively sense one of the first data stored in the first resistive memory cell 120 and the third data stored in the third resistive memory cell 130 based on the bitline selection signal BSEL and the first sensing current IS1. The second bitline sense amplifier 240 may selectively sense one of the second data stored in the second resistive memory cell 220 and the fourth data stored in the fourth resistive memory cell 230 based on the bitline selection signal BSEL and the second sensing current IS2. For example, when the first bit BS1 of the bitline selection signal BSEL is activated, the first and second bitline sense amplifiers 140 and 240 may sense the first and second data based on the first and second sensing currents IS1 and IS2. When the second bit BS2 of the bitline selection signal BSEL is activated, the first and second bitline sense amplifiers 140 and 240 may sense the third and fourth data based on the first and second sensing currents IS1 and IS2.

Although FIG. 5 illustrates an example where one bitline selector selects (e.g., muxs) one of two bitlines and one bitline sense amplifier senses data from a resistive memory cell connected to the selected bitline, the present inventive concept can be adopted to an example where one bitline selector selects one of more than three bitlines and one bitline sense amplifier senses data from a resistive memory cell connected to the selected bitline.

The resistive memory device 100a according to example embodiments may efficiently generate the sensing currents IS1 and IS2 that have the substantially same amount (e.g., level) without any additional circuit (e.g., a current mirror). In addition, in the resistive memory device 100a, one bitline selector may select one of a plurality of bitlines based on the bitline selection signal BSEL, and one bitline sense amplifier may sense data from a resistive memory cell connected to the selected bitline. Accordingly, the resistive memory device 100a may have a relatively high integration degree and a relatively high data sensing performance.

Referring to FIG. 6, a resistive memory device 100b includes a first resistive memory cell 120, a second resistive memory cell 220, a reference current generator 160b, a first bitline sense amplifier 140 and a second bitline sense amplifier 240. The resistive memory device 100b may further include a fifth resistive memory cell 135 and a sixth resistive memory cell 235.

The first resistive memory cell 120, the second resistive memory cell 220, the first bitline sense amplifier 140 and the second bitline sense amplifier 240 in FIG. 6 may be substantially the same as the first resistive memory cell 120, the second resistive memory cell 220, the first bitline sense amplifier 140 and the second bitline sense amplifier 240 in FIG. 1, respectively.

The reference current generator 160b may include a first reference resistive memory cell 162b and a second reference resistive memory cell 164b. The reference current generator 160b in FIG. 6 may be substantially the same as the reference current generator 160 in FIG. 1, except that the gate electrodes of the first and second reference cell transistors RCT0 and RCT1 included in the first and second reference resistive memory cell 162b and 164b are connected to the first wordline WL0 or a second wordline WL1.

The fifth resistive memory cell 135 may be connected to the first bitline BL0. The fifth resistive memory cell 135 may store fifth data. The fifth resistive memory cell 135 may include a fifth resistive element CR4 and a fifth cell transistor CT4. The fifth resistive element CR4 may have a first terminal and a second terminal, and the first terminal of the fifth resistive element CR4 may be connected to the first bitline BL0. The fifth cell transistor CT4 may have a first electrode connected to the second terminal of the fifth resistive element CR4, a gate electrode connected to the second wordline WL1, and a second electrode connected to the source line voltage VSL.

The sixth resistive memory cell 235 may be connected to the second bitline BL1. The sixth resistive memory cell 235 may store sixth data. The sixth resistive memory cell 235 may include a sixth resistive element CR5 and a sixth cell transistor CT5. The sixth resistive element CR5 may have a first terminal and a second terminal, and the first terminal of the sixth resistive element CR5 may be connected to the second bitline BL1. The sixth cell transistor CT5 may have a first electrode connected to the second terminal of the sixth resistive element CR5, a gate electrode connected to the second wordline WL1, and a second electrode connected to the source line voltage VSL.

The first bitline sense amplifier 140 may selectively sense one of the first data stored in the first resistive memory cell 120 and the fifth data stored in the fifth resistive memory cell 135 based on the wordlines WL0 and WL1 and the first sensing current IS1. The second bitline sense amplifier 240 may selectively sense one of the second data stored in the second resistive memory cell 220 and the sixth data stored in the sixth resistive memory cell 235 based on the wordlines WL0 and WL1 and the second sensing current IS2. For example, when the first wordline WL0 is enabled, the first and second bitline sense amplifiers 140 and 240 may sense the first and second data based on the first and second sensing currents IS1 and IS2. When the second wordline WL1 is enabled, the first and second bitline sense amplifiers 140 and 240 may sense the fifth and sixth data based on the first and second sensing currents IS1 and IS2.

Although FIGS. 1, 5, and 6 do not show the bitline connectors 151, 153, 251, and 253, and precharge circuit 152, 154, 252, and 254, aspects of the present inventive concept may also include the bitline connectors 151, 153, 251, and 253, and precharge circuit 152, 154, 252, and 254 in the FIGS. 1, 5, and 6, respectively, as shown in the FIG. 3.

Although FIG. 6 illustrates an example where one bitline sense amplifier senses data from one of two resistive memory cells that are connected to the same bitline, the present inventive concept can be adopted to an example where one bitline sense amplifier senses data from one of more than three resistive memory cells that are connected to the same bitline.

Although FIG. 2 illustrates an example where one bitline sense amplifier includes eight transistors, the first and second bitline sense amplifiers 140 and 240 included in the resistive memory device 100 of FIG. 1, the resistive memory device 100a of FIG. 5 and the resistive memory device 100b of FIG. 6 may have various structures, according to example embodiments.

The resistive memory device according to example embodiments may include at least one selected from a magnetic random access memory (MRAM), a resistive random access memory (RRAM), a phase-change random access memory (PRAM) and a ferroelectric random access memory (FRAM). For example, the resistive memory cell included in the resistive memory device according to example embodiments may be implemented with a MRAM cell using ferromagnetic materials, a RRAM cell using complex metal oxide of variable resistance, a PRAM cell using phase-change materials or a FRAM cell using ferroelectric materials. In particular, the resistive memory cell may be implemented with a spin-transfer torque magneto-resistive random access memory (STT-MRAM) cell. In this case, the resistive element may be implemented with a magnetic tunnel junction (MTJ) element of magnetic materials. Such materials of the resistive element may have the resistance value depending on the magnitude and/or the direction of the applied current or voltage and may have characteristics of non-volatility of maintaining the resistance value even though power is off.

FIGS. 7A, 7B, 7C and 7D are diagrams illustrating examples of a resistive memory cell included in the resistive memory device according to example embodiments.

Figure 7A:
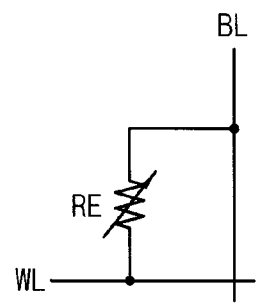
FIGS. 7A, 7B, 7C and 7D are diagrams illustrating examples of a resistive memory cell included in the resistive memory device according to example embodiments.
Figure 7B:
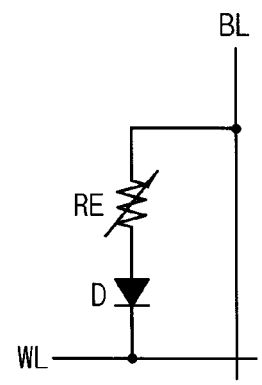
Figure 7C:
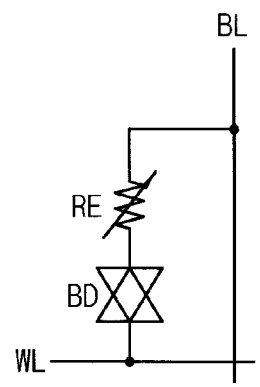
Figure 7D:
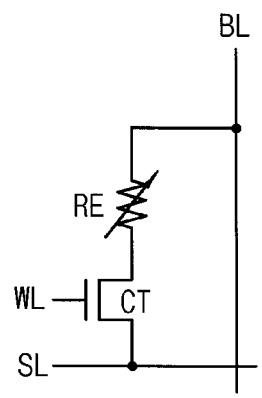

FIG. 7A illustrates a resistive memory cell without a selection element. FIGS. 7B, 7C and 7D illustrate resistive memory cells each of which includes a selection element.

Referring to FIG. 7A, a resistive memory cell may include a resistive element RE connected between a bitline BL and a wordline WL. In the resistive memory cell of FIG. 7A, the data write operation may be performed based on voltages applied to the bitline BL and the wordline WL.

Referring to FIG. 7B, a resistive memory cell may include a resistive element RE and a diode D that is serially connected between a bitline BL and a wordline WL. The configuration of the resistive memory cell of FIG. 7B may be adopted when the resistive element RE is a unipolar type. The resistive memory cell of FIG. 7B may determine a resistance distribution of the resistive element RE by controlling voltages applied to the bitline BL and the wordline WL. In the resistive memory cell of FIG. 7B, the data write operation may be performed by applying the voltages to the bitline BL and the wordline WL, thereby controlling a voltage difference between both ends of the resistive element RE or controlling a current flowing through the resistive element RE.

Referring to FIG. 7C, a resistive memory cell may include a resistive element RE and a bidirectional diode BD that is serially connected between a bitline BL and a wordline WL. The resistive memory cell of FIG. 7C may determine a resistance distribution of the resistive element RE by controlling voltages applied to the bitline BL and the wordline WL. In the resistive memory cell of FIG. 7C, the data write operation may be performed by applying the voltages to the bitline BL and the wordline WL, thereby controlling a voltage difference between both ends of the resistive element RE or controlling a current flowing through the resistive element RE.

Referring to FIG. 7D, a resistive memory cell may include a resistive element RE and a switching element (e.g., a cell transistor CT) that is serially connected between a bitline BL and a source line SL. A gate electrode of the cell transistor CT may be connected to a wordline WL. The resistive memory cell of FIG. 7D may determine a resistance distribution of the resistive element RE by controlling voltages applied to the bitline BL and the source line SL (e.g., a common source line). In the resistive memory cell of FIG. 7D, the data write operation may be performed by applying the voltages to the bitline BL and the source line SL, thereby controlling a voltage difference between both ends of the resistive element RE or controlling a current flowing through the resistive element RE.

The configuration of the resistive memory cell of FIG. 7C and the configuration of the resistive memory cell of FIG. 7D may be adopted when the resistive element RE is a bipolar type as well as a unipolar type. When the resistive element RE is a unipolar type, a resistance of the resistive element RE may be controlled by magnitude of applied voltage. When the resistive element RE is a bipolar type, the resistance of the resistive element RE may be controlled by direction (i.e. polarity) of the applied voltage as well as magnitude of the applied voltage.

Figure 8A:
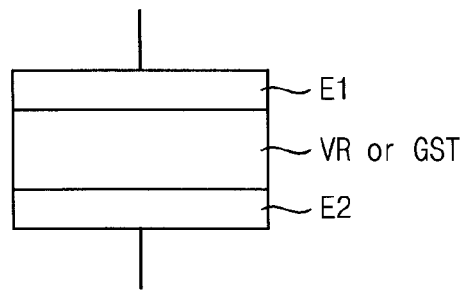
FIGS. 8A and 8B are diagrams illustrating examples of a resistive element included in the resistive memory cell according to example embodiments.
Figure 8B:
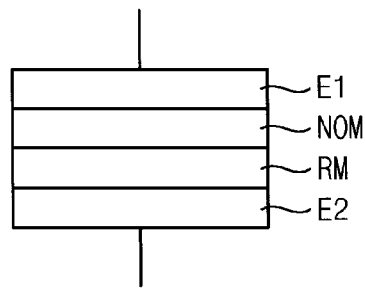

FIGS. 8A and 8B are diagrams illustrating examples of a resistive element included in the resistive memory cell according to example embodiments.

Referring to FIG. 8A, a resistive element may include a first electrode E1, a second electrode E2 and resistive material between the electrodes E1 and E2. The electrodes E1 and E2 may be formed with metal such as tantalum (Ta), platinum (Pt), etc. The resistive material may include transition-metal oxide (VR) such as cobalt oxide, or phase-change material such as GeSbTe (GST), etc. The phase-change material may be in amorphous state or in crystalline state depending on heating time and/or heating temperature, and thus the phase-change material may change its resistance according to phase-change.

PRAM using phase-change materials, RRAM using materials having variable resistance, MRAM using ferromagnetic materials and FRAM cell using ferroelectric materials may be differentiated from each other, however, those may be totally referred to as resistive memories. The resistive memory devices according to example embodiments may include various resistive memories including, for example, PRAM, RRAM, MRAM and FRAM.

The resistive material between the electrodes E1 and E2 is used to have a plurality of stable states having different resistance, and various resistive materials have been researched.

For example, while increasing a voltage applied to material having characteristic of Negative Differential Resistance (NDR), resistance of the NDR material may abruptly increase at a reset voltage (Vreset), the relatively high resistance may be maintained afterwards, and then the NDR material may transition to a state of relatively low resistance at a set voltage (Vset). In this case, the set voltage (Vset) for decreasing the resistance of the NDR material may be greater than the reset voltage (Vreset) for decreasing the resistance of the NDR material.

Chalcogenide using telluride compound such as GeSbTe may have relatively high resistance when relatively low voltage is applied, and may transition to a state of relatively low resistance if a sufficiently high voltage is applied. In this case, the set voltage (Vset) for decreasing the resistance of the Chalcogenide may be smaller than the reset voltage (Vreset) for decreasing the resistance of the Chalcogenide.

As such, an on-state of relatively low resistance and an off-state of relatively high resistance may be programmed or written into memory cells by applying the set voltage (Vset) and the reset voltage (Vreset) corresponding to characteristics of various materials included in the memory cells.

Referring to FIG. 8B, a resistive element may be bipolar type and may include a first electrode E1, a second electrode E2, non-ohmic material (NOM) and resistive material (RM) between the electrodes E1 and E2. In this case, the on-state and the off-state may be programmed or written into memory cells by applying opposite voltages to the electrodes E1 and E2. For example, the on-state and the off-state may be determined according to polarity of the applied voltage.

Figure 9:
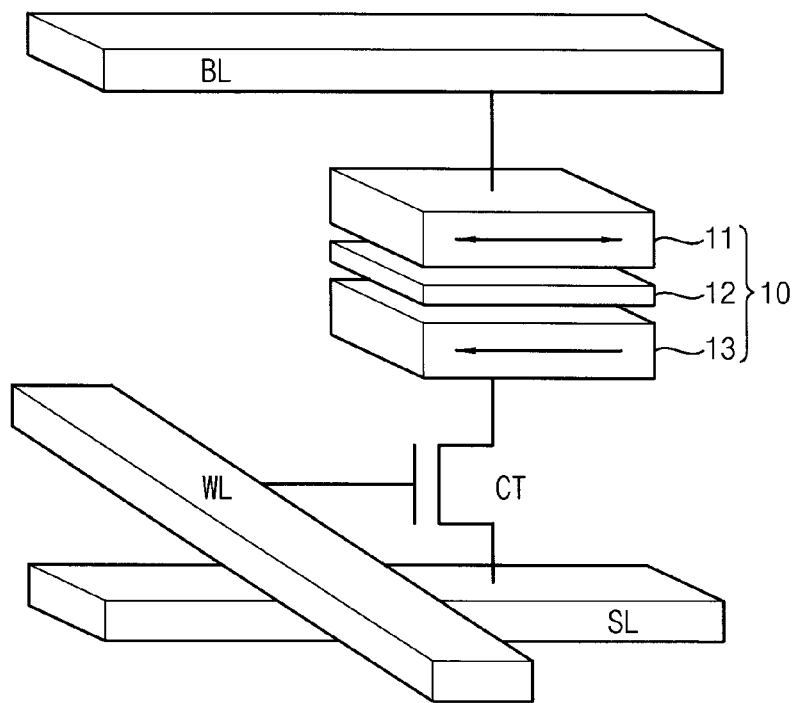
FIG. 9 is a diagram illustrating an example of a spin-transfer torque magneto-resistive random access memory (STT-MRAM) cell included in the resistive memory device according to example embodiments.

FIG. 9 is a diagram illustrating an example of a spin-transfer torque magneto-resistive random access memory (STT-MRAM) cell included in the resistive memory device according to example embodiments.

Referring to FIG. 9, an STT-MRAM cell may include a Magnetic Tunnel Junction MTJ element 10 and a cell transistor CT. A gate electrode of the cell transistor CT may be connected to a corresponding wordline WL, a first electrode of the cell transistor CT may be connected to a corresponding bitline BL via the MTJ element 10, and a second electrode of the cell transistor CT may be connected to a source line SL.

The MTJ element 10 may include a pinned layer 13, a free layer 11 and a barrier layer 12 between the two layers 11 and 13. The magnetization direction of the pinned layer 13 may be fixed, however, the magnetization direction of the free layer 11 may be varied, according to the written data, between the same direction as or opposite direction to the magnetization direction of the pinned layer 13. In some example embodiments, an anti-ferromagnetic layer (not illustrated) may be further included in the MTJ element 10 to enforce the magnetization direction of the pinned layer 13.

To perform the data write operation of the STT-MRAM cell, a voltage corresponding to the logic high level may be applied to the wordline WL to turn on the cell transistor CT, and a write current may be applied between the bitline BL and the source line SL.

To perform the data read operation of the STT-MRAM cell, the voltage corresponding to the logic high level may be applied to the wordline WL to turn on the cell transistor CT, a read current may be applied to flow from the bitline BL to the source line SL, and the resistance may be measured to determine the data stored in the MTJ element 10.

Figure 10A:
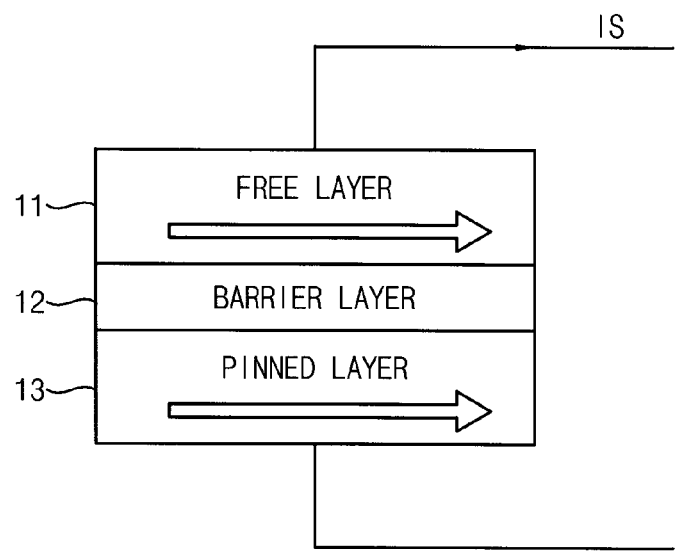
FIGS. 10A and 10B are diagrams for describing a data read operation of the STT-MRAM cell according to example embodiments.
Figure 10B:
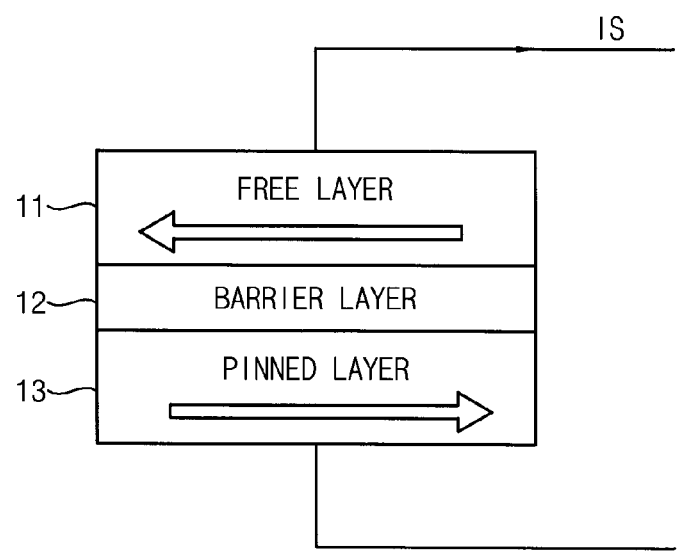

FIGS. 10A and 10B are diagrams for describing a data read operation of an STT-MRAM cell according to example embodiments.

The resistance of the MTJ element may be changed according to the magnetization direction of the free layer 11. When the sensing current IS is applied to the MTJ element, the data voltage or current depending on the resistance of the MTJ element may be output. The magnitude of the sensing current IS may be much smaller than the magnitude of the write current, and thus the magnetization direction of the free layer 11 may not be changed due to the sensing current IS.

Referring to FIG. 10A, the magnetization direction of the free layer 11 may be arranged parallel with the magnetization direction of the pinned layer 13. In this case, the MTJ element may have a relatively smaller resistance, and the data '0' may be read out by applying the sensing current IS.

Referring to FIG. 10B, the magnetization direction of the free layer 11 may be arranged opposite to the magnetization direction of the pinned layer 13. In this case, the MTJ element may have a relatively greater resistance, and the data '1' may be read out by applying the sensing current IS.

Figure 10C:
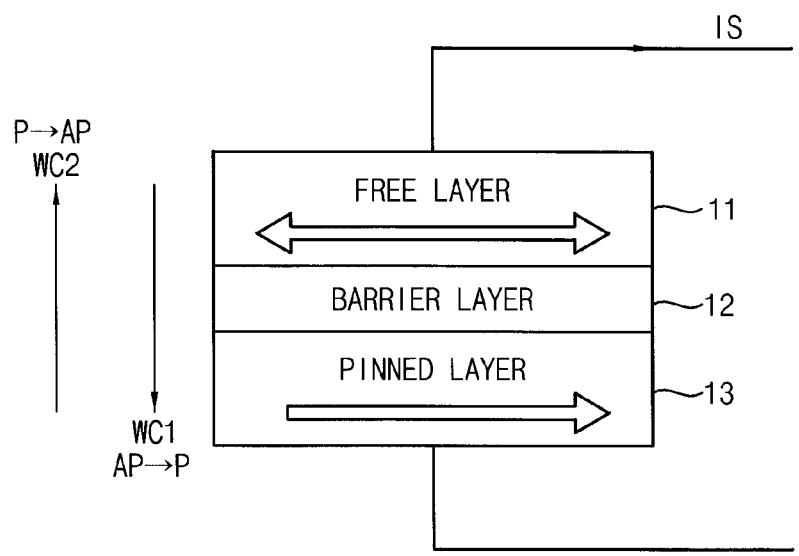
FIG. 10C is a diagram for describing a data write operation of the STT-MRAM cell according to example embodiments.

FIG. 10C is a diagram for describing a data write operation of the STT-MRAM cell according to example embodiments.

Referring to FIG. 10C, the magnetization direction of the free layer 11 may be determined depending on the write currents WC1 and WC2. For example, when the first write current WC1 is applied to the MTJ element, the free electrons having the same spin direction as the pinned layer 13 may apply a torque to the free layer 11, and thus the free layer 11 may be magnetized in the same direction as, that is, parallel direction (P) with the pinned layer 13. When the second write current WC2 is applied to the MTJ element, the free electrons having the opposite spin direction to the pinned layer 13 may apply a torque to the free layer 11, and thus the free layer 11 may be magnetized in the opposite direction as, that is, anti-parallel direction (AP) with the pinned layer 13. As such the magnetization direction of the free layer 11 in the MTJ element may be changed by the spin-transfer torque (STT).

FIGS. 10D, 10E, 10F, 10G and 10H are diagrams illustrating examples of a magnetic tunnel junction (MTJ) element included in the STT-MRAM cell according to example embodiments.

Figure 10D:
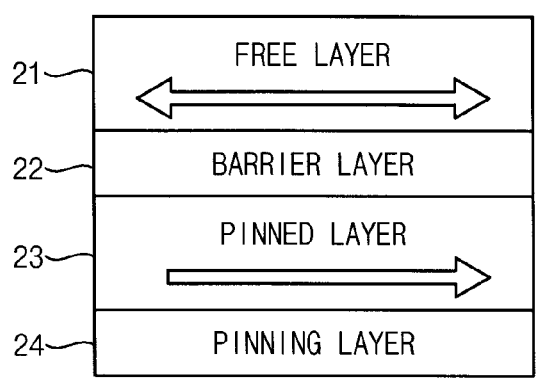
FIGS. 10D, 10E, 10F, 10G and 10H are diagrams illustrating examples of a magnetic tunnel junction (MTJ) element included in the STT-MRAM cell according to example embodiments.
Figure 10E:
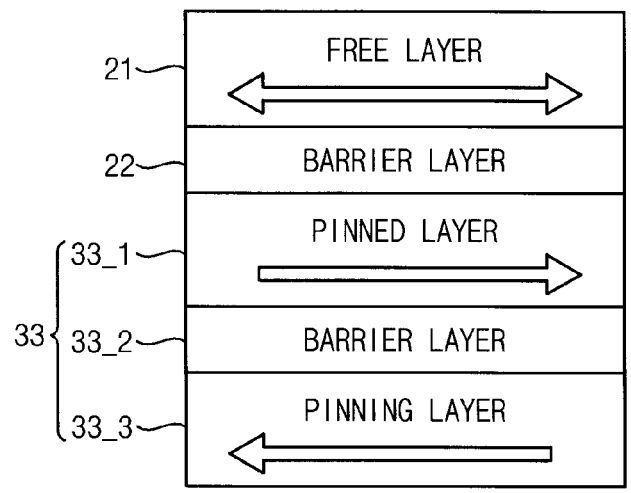

FIGS. 10D and 10E illustrate examples of the MTJ element having the horizontal magnetization, corresponding to a case that the direction of an applied current is substantially perpendicular to the easy-magnetization axis.

Referring to FIG. 10D, an MTJ element 20 may include a free layer 21, a barrier layer 22, a pinned layer 23 and a pinning layer 24.

The free layer 21 may include materials having a variable magnetization direction. The magnetization direction of the free layer 21 may be varied depending on internal and/or external electrical and/or magnetic factors. The free layer 21 may be implemented with ferromagnetic materials including at least one of cobalt (Co), iron (Fe) and nickel (Ni). For example, the free layer 21 may include at least one selected from the group consisting of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The barrier layer 22 may have a thickness less than a spin diffusion distance. The barrier layer 22 may be implemented with non-magnetic materials. For example, the barrier layer 22 may include at least one selected from the group consisting of magnesium (Mg), titanium (Ti), aluminum (Al), a magnesium-zinc (MgZn) oxide, a magnesium-boron (MgB) oxide, a Ti nitride, and a vanadium (V) nitride.

The pinned layer 23 may have the magnetization direction that is fixed by the pinning layer 24. The pinned layer 23 may be implemented with ferromagnetic materials. For example, the pinned layer 23 may include at least one selected from the group consisting of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The pinning layer 24 may be implemented with anti-ferromagnetic materials. For example, the pinning layer 24 may include at least one selected from the group consisting of PtMn, IrMn, MnO, MnS, MnTe, $MnF_2$, $FeCl_2$, FeO, $CoCl_2$, CoO, $NiCl_2$, NiO, and Cr.

When the free layer and the pinned layer are implemented with ferromagnetic materials, a stray field may be generated in edge portions of the ferromagnetic materials. The stray field may decrease magneto-resistance or increase the resistive magnetism in the free layer, thereby causing asymmetric switching. Thus, the MTJ element may require structure for reducing or controlling the stray field due to the ferromagnetic materials.

Referring to FIG. 10E, a fixed layer 33 in an MTJ element 30 may be implemented with synthetic anti-ferromagnetic (SAF) materials. The fixed layer 33 may include a pinned layer 33_1, a barrier layer 33_2 and a pinning layer 33_3. Each of the pinned layer 33_1 and the pinning layer 33_3 may include at least one selected from the group consisting of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. The magnetization directions of the pinned layer 33_1 and the pinning layer 33_3 may be different from each other, and the magnetization directions of the pinned layer 33_1 and the pinning layer 33_3 may be fixed, respectively. The barrier layer 33_2 may include Ru.

Figure 10F:
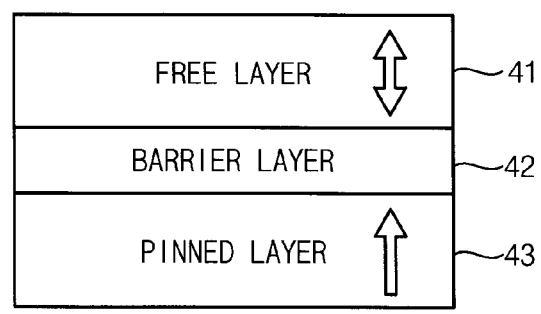

FIG. 10F illustrates an example of the MTJ element having the vertical magnetization, corresponds to a case that the direction of an applied current is substantially parallel with the easy-magnetization axis.

Referring to FIG. 10F, an MTJ element 40 includes a free layer 41, a barrier layer 42 and a pinned layer 43.

The MTJ element 40 may have a relatively smaller resistance when the magnetization direction of the free layer 41 is parallel with the magnetization direction of the pinned layer 43. The MTJ element 40 may have a relatively greater resistance when the magnetization direction of the free layer 41 is opposite to the magnetization direction of the pinned layer 43. The data may be stored as the resistance.

To implement the MTJ element 40 having the vertical magnetization, the free layer 41 and the pinned layer 43 may be implemented with materials having higher magnetic anisotropic energy such as alloys of amorphous rare-earth elements, multilayer thin films as (Co/Pt)n and (Fe/Pt)n, superlattice materials of L10 crystalline structure. The free layer 41 may be an ordered alloy including at least one selected from the group consisting of Fe, Co, Ni, palladium (Pa), and platinum (Pt). For example, the free layer 41 may include at least one selected from the group consisting of Fe—Pt alloy, Fe—Pd alloy, Co—Pd alloy, Co—Pt alloy, Fe—Ni—Pt alloy, Co—Fe—Pt alloy, and Co—Ni—Pt alloy. Such alloys may be, quantochemically, $Fe_{50}Pt_{50}$, $Fe_{50}Pd_{50}$, $Co_{50}Pd_{50}$, $CO_{50}Pt_{50}$, $Fe_{30}Ni_{20}Pt_{50}$, $CO_{30}Fe_{20}Pt_{50}$, or $CO_{30}Ni_{20}Pt_{50}$.

The pinned layer 43 may be an ordered alloy including at least one selected from the group consisting of Fe, Co, Ni, Pa, and Pt. For example, the pinned layer 43 may include at least one of Fe—Pt alloy, Fe—Pd alloy, Co—Pd alloy, Co—Pt alloy, Fe—Ni—Pt alloy, Co—Fe—Pt alloy, and Co—Ni—Pt alloy. Such alloys may be, quantochemically, $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $CO_{30}Fe_{20}Pt_{50}$, or $CO_{30}Ni_{20}Pt_{50}$.

Figure 10G:
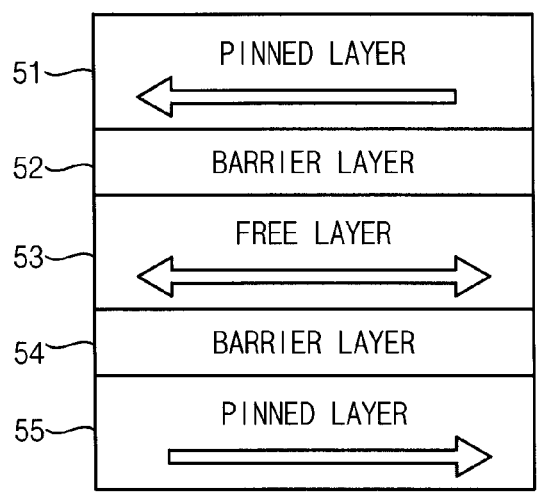
Figure 10H:
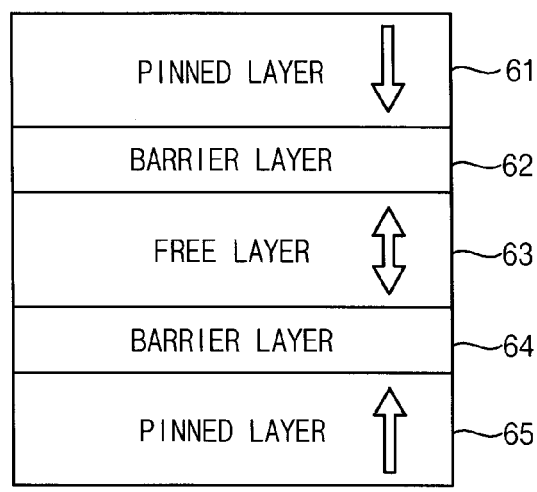

FIGS. 10G and 10H illustrate examples of a dual MTJ element having a structure that two pinned layers and two barrier layers are centered on a free layer.

Referring to FIG. 10G, a dual MTJ element 50 forming horizontal magnetization may include a first pinned layer 51, a first barrier layer 52, a free layer 53, a second barrier layer 54 and a second pinned layer 55. The materials forming the respective layers may be the same as or similar to the materials of the free layer 21, the barrier layer 22 and the pinned layer 23 in FIG. 10D.

In some example embodiments, when the magnetization direction of the first pinned layer 51 is fixed in the opposite direction to the magnetization direction of the second pinned layer 55, the magnetic fields due to the first and second pinned layers 51 and 55 may be interfered destructively. Accordingly, the data may be written in the dual MTJ element 50 using the smaller write current than the single MTJ element. Also, the exact data may be read from the dual MTJ element 50 because the MTJ element 50 provides the greater resistance value due to the second barrier layer 54.

Referring to FIG. 10H, a dual MTJ element 60 forming vertical magnetization may include a first pinned layer 61, a first barrier layer 62, a free layer 63, a second barrier layer 64 and a second pinned layer 65. The materials forming the respective layers may be the same as or similar to the materials of the free layer 41, the barrier layer 42 and the pinned layer 43 in FIG. 10F.

In some example embodiments, when the magnetization direction of the first pinned layer 61 is fixed in the opposite direction to the magnetization direction of the second pinned layer 65, the magnetic fields due to the first and second pinned layers 61 and 65 may be interfered destructively. Accordingly, the data may be written in the dual MTJ element 60 using the smaller write current than the single MTJ element.

Figure 11:
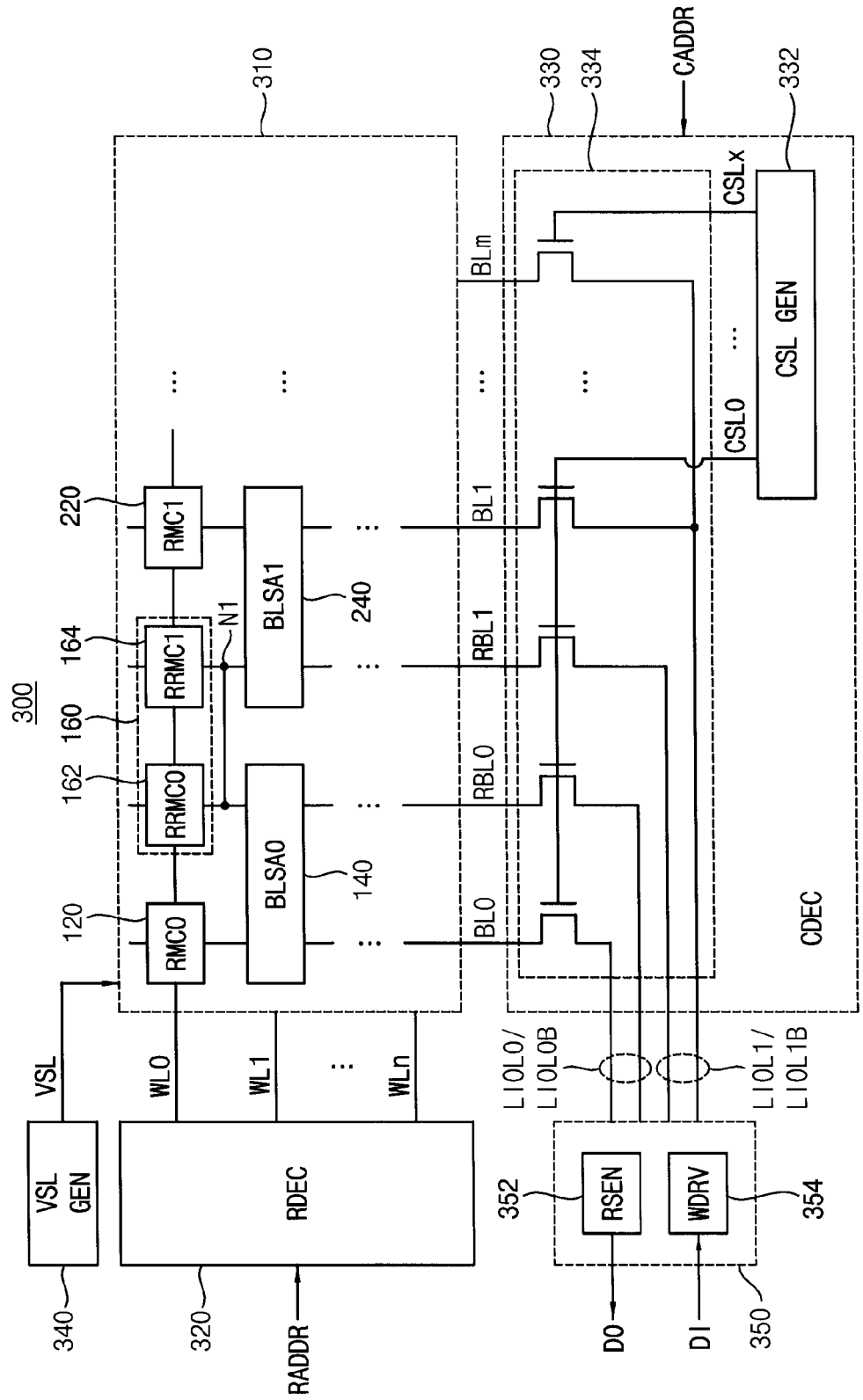
FIG. 11 is a block diagram illustrating a resistive memory device according to example embodiments.

FIG. 11 is a block diagram illustrating a resistive memory device according to example embodiments.

FIG. 11 illustrates a resistive memory device 300 including a local I/O circuit 350 that is connected to the bitlines BL0 through BLm via the local I/O lines LIOL0/LIOL0B and LIOL1/LIOL1B. Some components of the resistive memory device 300 are omitted in FIG. 11 for convenience of illustration.

Referring to FIG. 11, the resistive memory device 300 includes a memory cell array 310, a row decoder 320, a column decoder 330, a source line voltage generator 340 and the local I/O circuit 350.

The memory cell array 310 may include a plurality of resistive memory cells and a plurality of bitline sense amplifiers. The plurality of resistive memory cells may be disposed at positions crossed by wordlines WL0, WL1, ..., WLn and bitlines BL0, BL1, ..., BLm. Each resistive memory cell may include a cell transistor CT and a resistive element CR and may have a resistance depending on programmed data.

The plurality of resistive memory cells and the plurality of bitline sense amplifiers may be implemented with the example described above with reference to FIG. 1. For example, a first resistive memory cell 120 may be connected to a first bitline BL0. A second resistive memory cell 220 may be connected to a second bitline BL1. A reference current generator 160 may include a first reference resistive memory cell 162 connected to a first reference bitline RBL0 and a second reference resistive memory cell 164 connected to a second reference bitline RBL1. A first bitline sense amplifier 140 may be connected to the first bitline BL0 and the first reference bitline RBL0. A second bitline sense amplifier 240 may be connected to the second bitline BL1 and the second reference bitline RBL1. The first and second bitline sense amplifiers 140 and 240 may be directly connected to each other at a first common node N1. The first and second reference resistive memory cells 162 and 164 may be electrically connected to the first common node N1. The sensing currents IS1 and IS2 that have the substantially same amount (e.g., a current level) may be efficiently generated without any additional circuit (e.g., a current mirror), and the first and second data that are stored in the resistive memory cells 120 and 220 may be substantially simultaneously sensed based on the sensing currents IS1 and IS2 and the bitline sense amplifiers 140 and 240. Accordingly, the resistive memory device 300 may have a relatively high integration degree and a relatively high data sensing performance.

The row decoder 320 may enable at least one of the wordlines WL0~WLn and may select at least one of the plurality of resistive memory cells based on a row address RADDR. Although not illustrated in FIG. 11, the row decoder 320 may include a decoding circuit for decoding the row address RADDR and a wordline driving circuit for applying a wordline selection voltage or a wordline non-selection voltage to the wordlines WL0~WLn, respectively, in response to the outputs of the decoding circuit.

The column decoder 330 may enable at least one of the bitlines BL0~BLm and may select at least one of the plurality of resistive memory cells based on a column address CADDR. The column decoder 330 may include a column selection signal generator 332 and a column gating circuit 334. The column selection signal generator 332 may generate column selection signals CSL0~CSLx based on the column address CADDR. The column gating circuit 334 may include a plurality of column selection switches connected to the bitlines BL0~BLm. The column selection switches may be selectively turned on in response to the column selection signals CSL0~CSLx. As illustrated in FIG. 11, the switches NS0~NSm may be implemented with NMOS transistors. The pairs of bitlines BL0/RBL0 and BL1/RBL1 may be connected to the pairs of local I/O lines LIOL0/LIOL0B and LIOL1/LIOL1B, respectively, by the column gating circuit 334.

The source line voltage generator 340 may generate a source line voltage VSL. Each resistive memory cell may be connected to a source line, and the source line voltage generator 340 may provide the source line voltage VSL to each resistive memory cell via the source line. In some example embodiments, the plurality of resistive memory cells may be connected to a common source line. In other example embodiments, the memory cell array 310 may be divided into at least two regions, and the plurality of resistive memory cells may be connected to different source lines depending on positions where the plurality of resistive memory cells are disposed.

The local I/O circuit 350 may include a read sensing circuit 352 and a write driver 354. The local I/O circuit 350 may be connected to the bitlines via the column decoder 330. The read sensing circuit 352 may perform the data read operation to sense the data stored in the resistive memory cells to provide the read data DO. The write driver 354 may perform the data write operation to write the input data DI in the resistive memory cells. The read sensing circuit 352 and the write driver 354 may be formed inseparably or separately.

Figure 12:
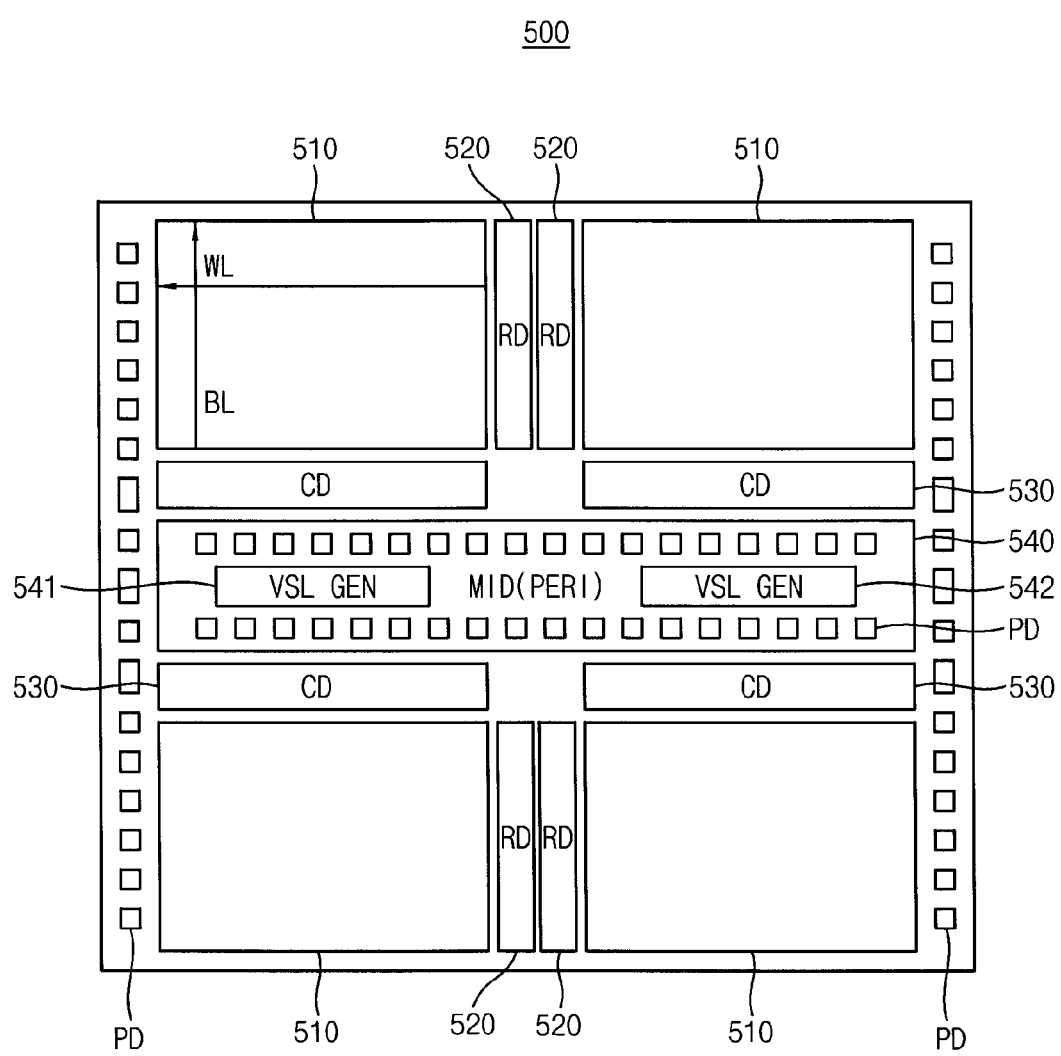
FIG. 12 is a plan view illustrating a layout of a resistive memory device according to example embodiments.

FIG. 12 is a plan view illustrating a layout of a resistive memory device according to example embodiments.

Referring to FIG. 12, a resistive memory device 500 may include a plurality of bank arrays 510. As will be described below with reference to FIG. 13, each bank array may include a plurality of sub array blocks and a plurality of bitline sense amplifier blocks disposed adjacent to the plurality of sub array block. Although FIG. 12 illustrates an example where the resistive memory device 500 includes four bank arrays 510, the number of the bank arrays included in the resistive memory device may be changed.

Row decoders 520 and column decoders 530 may be disposed adjacent to the bank arrays 510, respectively. The row decoders 520 may be disposed in a wordline direction of the resistive memory device 500, and the column decoders 530 may be disposed in a bitline direction of the resistive memory device 500. Two row decoders allocated respectively to two adjacent bank arrays may be disposed adjacent to each other and may share a control line (not illustrated) therebetween.

Pads PD may be disposed in peripheral regions that are disposed in the edges and center of the resistive memory device 500. The pads PD may be used to communicate with an external device (e.g., a host). Source line voltage generators 541 and 542 may be disposed in the peripheral region disposed in the center of the resistive memory device 500. The row decoders 520, the column decoders 530, and the source line voltage generators 541 and 542 may constitute peripheral circuits.

Although FIG. 12 illustrates example where the resistive memory device 500 includes two source line voltage generators 541 and 542, the number of the source line voltage generators included in the resistive memory device may be substantially equal to the number of the bank arrays 510, and thus the source line voltage can be respectively applied to the bank arrays 510.

Figure 13:
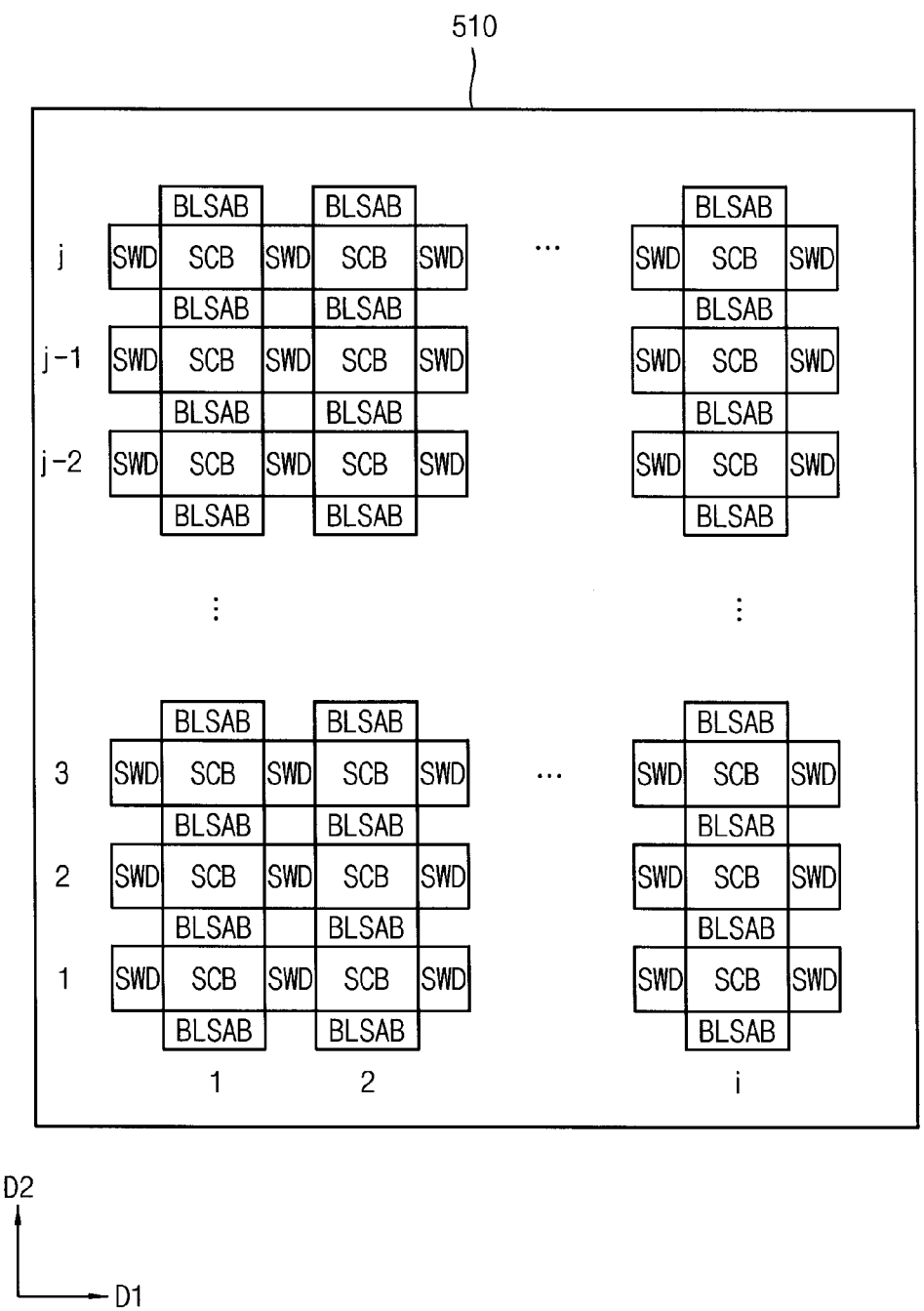
FIG. 13 is a plan view illustrating a layout of a bank array included in the resistive memory device of FIG. 12 according to example embodiments.

FIG. 13 is a plan view illustrating a layout of a bank array included in the resistive memory device of FIG. 12 according to example embodiments.

Referring to FIG. 13, in a bank array 510, i sub array blocks SCB may be disposed in a first direction D1, and j sub array blocks SCB may be disposed in a second direction D2 crossing the first direction D1, where each of i and j is a natural number. A plurality of bitlines, a plurality of wordlines, and a plurality of STT-MRAM cells may be disposed in each of the sub array blocks SCB. The plurality of STT-MRAM cells may be disposed at intersections between the bitlines and the wordlines.

(i+1) sub wordline driver blocks SWD may be disposed between the sub array blocks SCB in the first direction D1. Sub wordline drivers may be disposed in the sub wordline driver blocks SWD.

(j+1) bitline sense amplifier blocks BLSAB may be disposed between the sub array blocks SCB in the second direction D2. Bitline sense amplifiers to sense data stored in resistive memory cells may be disposed in the bitline sense amplifier blocks BLSAB.

The sub array blocks SCB may include the first resistive memory cell 120 in FIG. 1, the second resistive memory cell 220 in FIG. 1 and the reference current generator 160 in FIG. 1. In some example embodiments, the first and second resistive memory cells 120 and 220 and the reference current generator 160 may be disposed in the same sub array block. In other example embodiments, the first and second resistive memory cells 120 and 220 and the reference current generator 160 may be respectively disposed in different sub array blocks.

The bitline sense amplifier blocks BLSAB may include the first bitline sense amplifier 140 in FIG. 1 and the second bitline sense amplifier 240 in FIG. 1. In some example embodiments, the first bitline sense amplifier 140 and the second bitline sense amplifier 240 may be disposed in the same bitline sense amplifier block. In other example embodiments, the first bitline sense amplifier 140 and the second bitline sense amplifier 240 may be respectively disposed in different bitline sense amplifier blocks.

Figure 14:
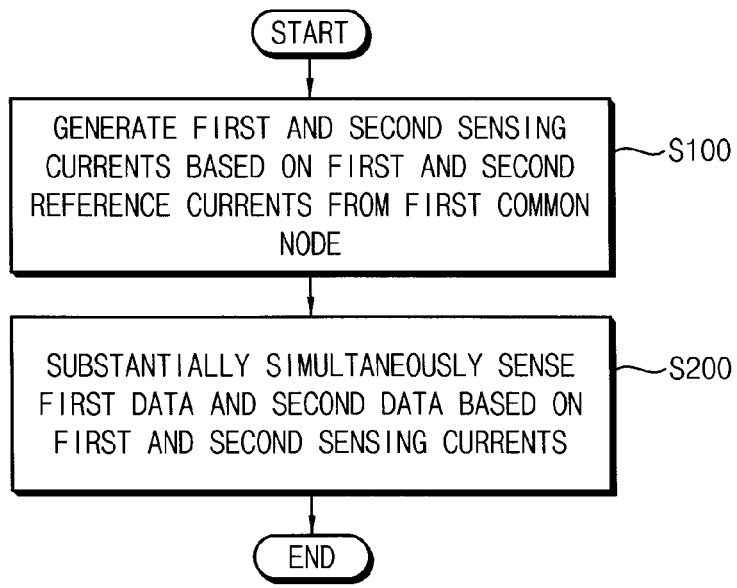
FIG. 14 is a flow chart illustrating a method of reading data from a resistive memory device according to example embodiments.

FIG. 14 is a flow chart illustrating a method of performing a read operation for a resistive memory device according to example embodiments.

Referring to FIGS. 1 and 14, a first sensing current IS1 and a second sensing current IS2 are generated based on a first reference current IR1, a second reference current IR2 from a first common node N1 (step S100). The amount of the second reference current IR2 is different from the amount of the first reference current IR1. The amount of the second sensing current IS2 is substantially the same as the amount of the first sensing current IS1. The first reference current IR1 and the second reference current IR2 are provided to the first common node N1 and the first and second sensing currents IS1 and IS2 are provided from the first common node N1.

First data and second data are substantially simultaneously sensed, by a first bitline sense amplifier 140 and a second bitline sense amplifier 240, based on the first and second sensing currents IS1 and IS2. The first data is stored in a first resistive memory cell 120, and the second data is stored in a second resistive memory cell 220. For example, the first bitline sense amplifier 140 may be connected to the first resistive memory cell 120 via a first bitline BL0 and may sense the first data of the first resistive memory cell 120. The second bitline sense amplifier 240 may be connected to the second resistive memory cell 220 via a second bitline BL1 and may sense the second data of the second resistive memory cell 220.

The first and second bitline sense amplifiers 140 and 240 may be directly connected to the first common node N1, and a reference current generator 160 that generates the first and second reference currents IR1 and IR2 may be connected to the first common node Ni.

Figure 15:
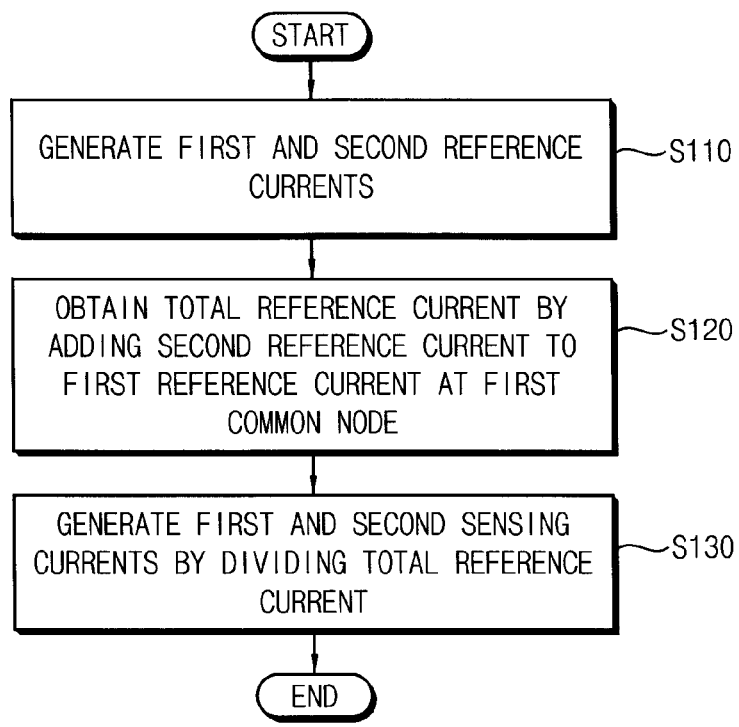
FIG. 15 is a flow chart illustrating an example of generating first and second sensing currents in FIG. 14 according to example embodiments.

FIG. 15 is a flow chart illustrating an example of generating first and second sensing currents in FIG. 14 according to example embodiments.

Referring to FIGS. 1, 2, 14 and 15, in the step S100, the first and second reference currents IR1 and IR2 may be generated based on a first reference resistive memory cell 162 storing first reference data and a second reference resistive memory cell 164 storing second reference data (step S110). The first and second reference resistive memory cells 162 and 164 may be included in the reference current generator 160. For example, the first reference data may correspond to a first logic level (e.g., '1'), and the first reference current IR1 may be generated based on the first reference data. The second reference data may correspond to a second logic level (e.g., '0'), and the second reference current IR2 may be generated based on the second reference data.

A total reference current may be obtained by adding the second reference current IR2 to the first reference current IR1 at the first common node N1 (step S120). The first and second sensing currents IS1 and IS2 may be generated by dividing the total reference current into the first and second sensing currents IS1 and IS2 based on a first load and a second load (step S130). The first load may be based on the first resistive memory cell 120 and the first bitline sense amplifier 140, and the second load may be based on the second resistive memory cell 220 and the second bitline sense amplifier 240. For example, the second bitline sense amplifier 240 may have a structure substantially the same as that of the first bitline sense amplifier 140, and the second resistive memory cell 220 may have a structure substantially the same as that of the first resistive memory cell 120. Thus, each of the amount of the first sensing current IS1 and the amount of the second sensing current IS2 may be substantially the same as a half of the amount of the total reference current.

The resistive memory device 100 according to example embodiments may include two bitline sense amplifiers 140 and 240 that are connected to the first common node N1 and have the substantially same structure. A pair of the reference bitlines RBL0 and RBL1 and a pair of the reference resistive memory cells 162 and 164 that store different reference data may be shared by two bitline sense amplifiers 140 and 240. Thus, the resistive memory device 100 may efficiently generate the sensing currents IS1 and IS2 that have the substantially same amount (e.g., magnitude or level) without any additional circuit (e.g., a current mirror). Accordingly, the resistive memory device 100 may have a relatively high integration degree and a relatively high data sensing performance.

Figure 16:
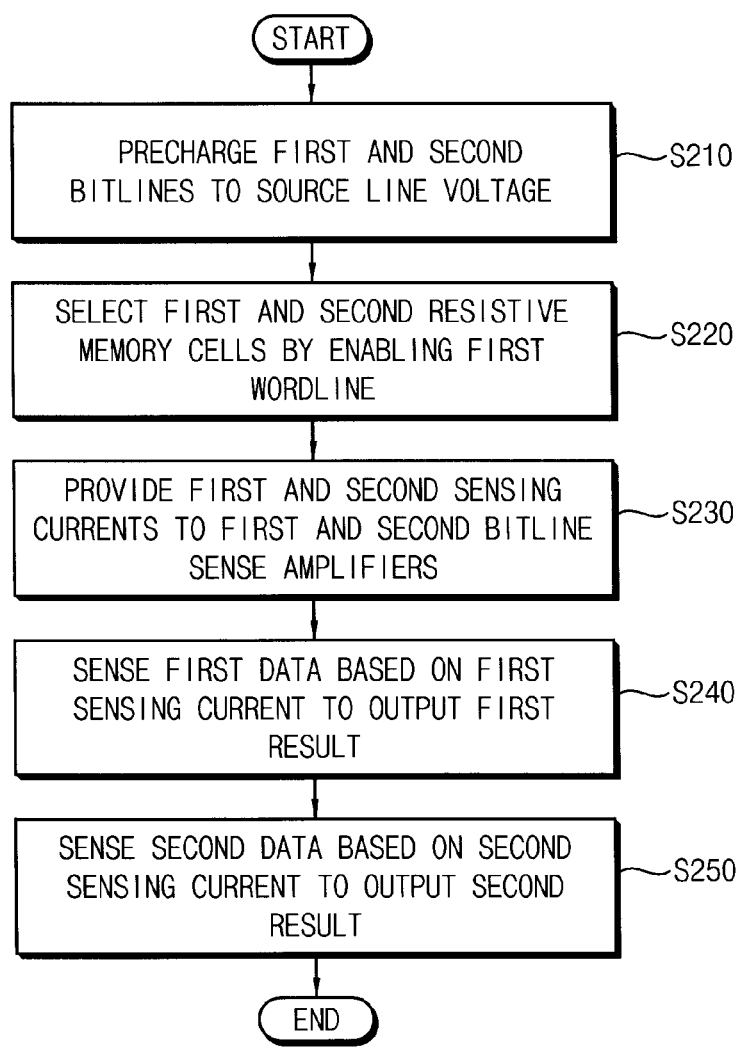
FIG. 16 is a flow chart illustrating an example of substantially simultaneously sensing first and second data in FIG. 14 according to example embodiments.

FIG. 16 is a flow chart illustrating an example of substantially simultaneously sensing first and second data in FIG. 14 according to example embodiments.

Referring to FIGS. 2, 14 and 16, in the step S200, the first bitline BL0 and the second bitline BL1 may be precharged to a source line voltage VSL based on a precharge control signal PC (step S210). The first bitline BL0 may be connected to the first resistive memory cell 120, and the second bitline BL1 may be connected to the second resistive memory cell 220.

The first and second resistive memory cells 120 and 220 may be selected by enabling a first wordline WL0 connected to the first and second resistive memory cells 120 and 220 (step S220).

The first and second sensing currents IS1 and IS2 may be provided to the first and second bitline sense amplifiers 140 and 240 based on a read column selection signal RCSL (step S230).

The first data may be sensed, by the first bitline sense amplifier 140, based on a sensing enable signal SAE and the first sensing current IS1 to output a first result of sensing the first data (e.g., first output voltages VOUT0/VOUT0B) (step S240).

The second data may be sensed, by the second bitline sense amplifier 240, based on the sensing enable signal SAE and the second sensing current IS2 to output a second result of sensing the second data (e.g., second output voltages VOUT1/VOUT1B) (step S250). The first result and the second result may be substantially simultaneously output.

Figure 17:
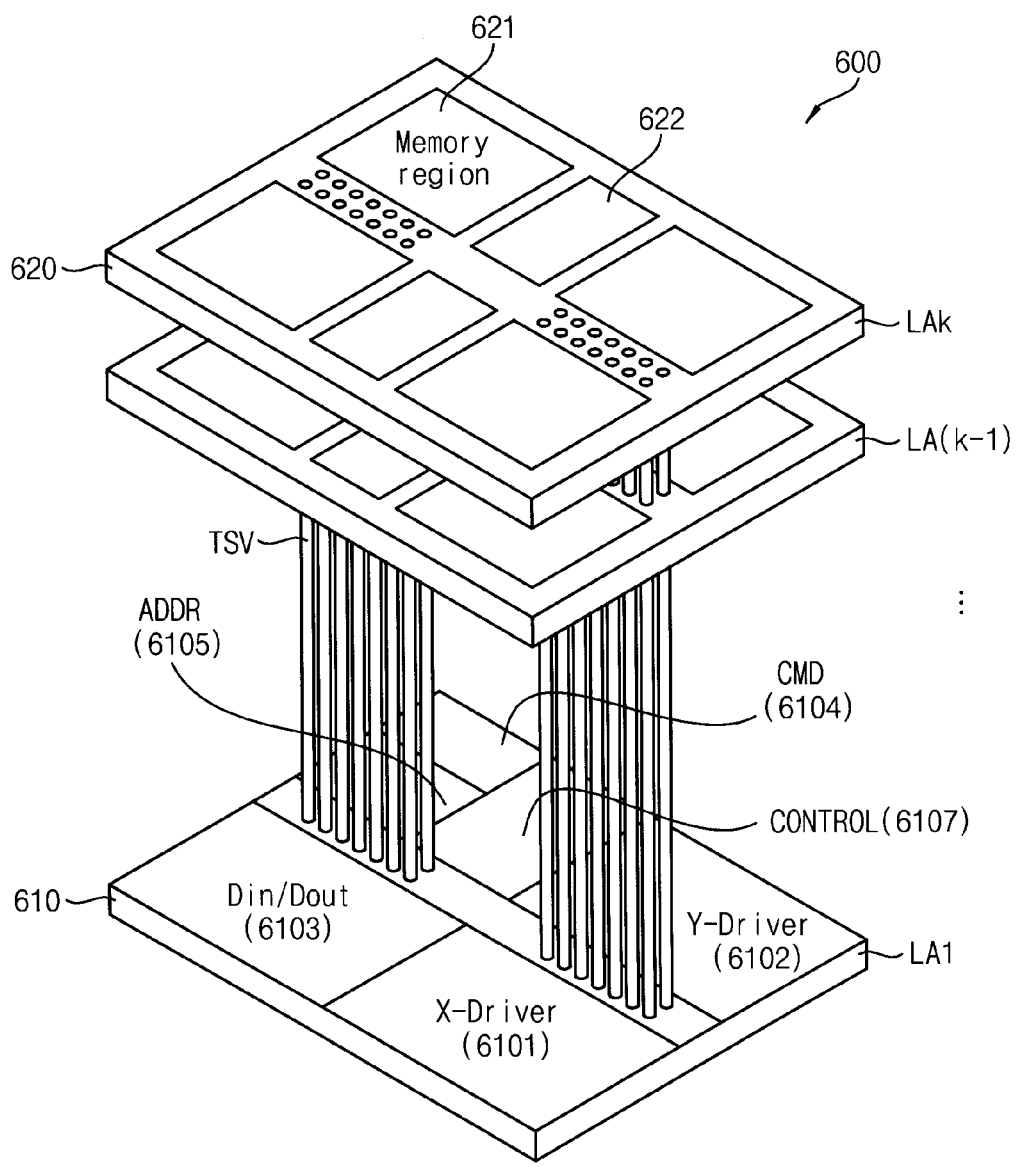
FIG. 17 is a diagram illustrating a resistive memory device according to example embodiments.

FIG. 17 is a diagram illustrating a resistive memory device according to example embodiments.

Referring to FIG. 17, a resistive memory device 600 may include first through k-th semiconductor integrated circuit layers LA1, . . . , LA(k−1), LAk, where k is a natural number. Assuming that the lowest first semiconductor integrated circuit layer LA1 may be a master chip (e.g., an interface or control chip) and the other semiconductor integrated circuit layers may be slave chips including core memory chips. The first through k-th semiconductor integrated circuit layers LA1 through LAk may transmit and receive signals therebetween through through-substrate vias (e.g., through-silicon vias TSVs). The lowest first semiconductor integrated circuit layer LA1 as the master chip may communicate with an external memory controller (not illustrated) through a conductive structure (not illustrated) formed on an external surface.

Example embodiments will be described based on a structure and an operation of the resistive memory device 600 by mainly using the first semiconductor integrated circuit layer LA1 or 610 as the master chip and the k-th semiconductor integrated circuit layer LAk or 620 as the slave chip.

The first semiconductor integrated circuit layer 610 may include various circuits for driving memory regions 621 included in the k-th semiconductor integrated circuit layer 620. For example, the first semiconductor integrated circuit layer 610 may include a row driver 6101 for driving wordlines, a column driver 6102 for driving bitlines, a data I/O circuit 6103 for controlling I/O of data, a command buffer 6104 for receiving a command from the external memory controller and for buffering the command, and an address buffer 6105 for receiving an address from the external memory controller and for buffering the address.

The first semiconductor integrated circuit layer 610 may further include a control logic 6107. The control logic 6107 may control an access to the memory regions 621 based on the command and the address from the external memory controller and may generate control signals for accessing the memory regions 621.

The k-th semiconductor integrated circuit layer 620 may include the memory regions 621 including a memory cell array and peripheral circuit regions 622 in which peripheral circuits for reading/writing data of the memory regions 621 are arranged. Each memory region may include a plurality of sub array blocks described above with reference to FIGS. 12 and 13, and each sub array block may include a plurality of resistive memory cells described above with reference to FIGS. 7A, 7B, 7C, 7D, 8A, 8B, 9, 10A, 10B, 10C, 10D, 10E, 10F, 10G and 10H. The peripheral circuit regions 622 may include a row decoder, a column decoder, etc.

The resistive memory device 600 according to example embodiments may include two bitline sense amplifiers that are directly connected to a first common node and have the substantially same structure. A pair of reference bitlines and a pair of reference resistive memory cells that store different reference data may be shared by two bitline sense amplifiers. Thus, the resistive memory device 600 may efficiently generate sensing currents that have the substantially same amount without any additional circuit (e.g., a current mirror). Accordingly, the resistive memory device 600 may have a relatively high integration degree and a relatively high data sensing performance.

Figure 18:
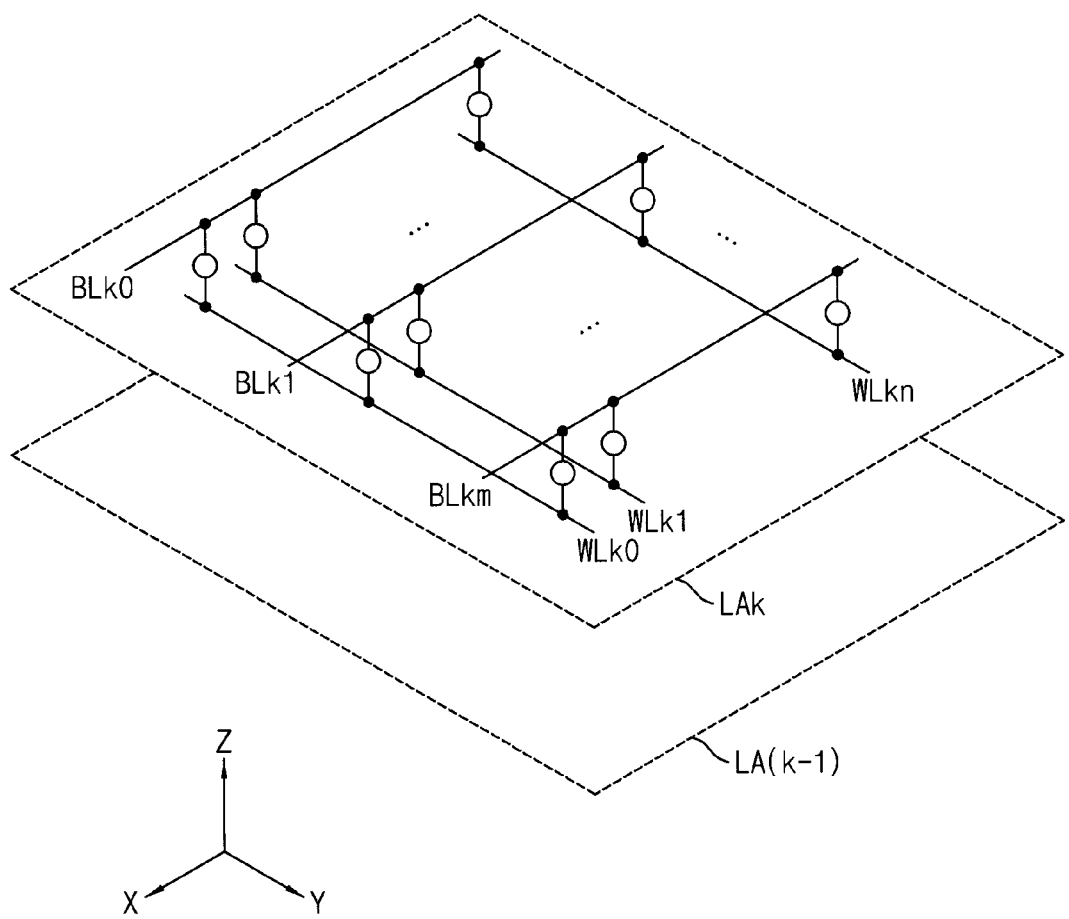
FIG. 18 is a diagram illustrating a configuration of semiconductor integrated circuit layers included in the resistive memory device of FIG. 17 according to example embodiments.

FIG. 18 is a diagram illustrating a configuration of semiconductor integrated circuit layers included in the resistive memory device of FIG. 17 according to example embodiments.

Referring to FIG. 18, the k-th semiconductor integrated circuit layer LAk may include a plurality of (e.g., (m+1)) bitlines BLk0, BLk1, . . . , BLkm disposed lengthwise in the X axis direction with a predetermined space therebetween and a plurality of (e.g., (n+1)) word-lines WLk0, WLk1, . . . , WLkn disposed lengthwise in the Y axis direction with a predetermined space therebetween. A resistive memory cell may be disposed at each of intersection points of the word-lines WLk0~WLkn and the bitlines BLk0~BLkm. The resistive memory cell may be one of examples described above with reference to FIGS. 7A, 7B, 7C, 7D, 8A, 8B, 9, 10A, 10B, 10C, 10D, 10E, 10F, 10G and 10H.

Although FIG. 18 illustrates the k-th semiconductor integrated circuit layer LAk in detail, each configuration of the other semiconductor integrated circuit layers may be similar to the configuration of the k-th semiconductor integrated circuit layer LAk.

Figure 19:
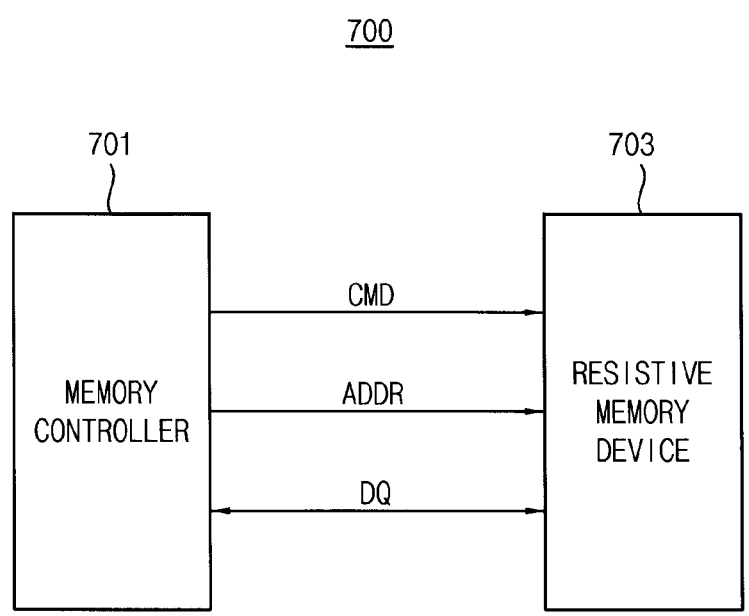
FIGS. 19 and 20 are block diagrams illustrating a memory system according to example embodiments.
Figure 20:
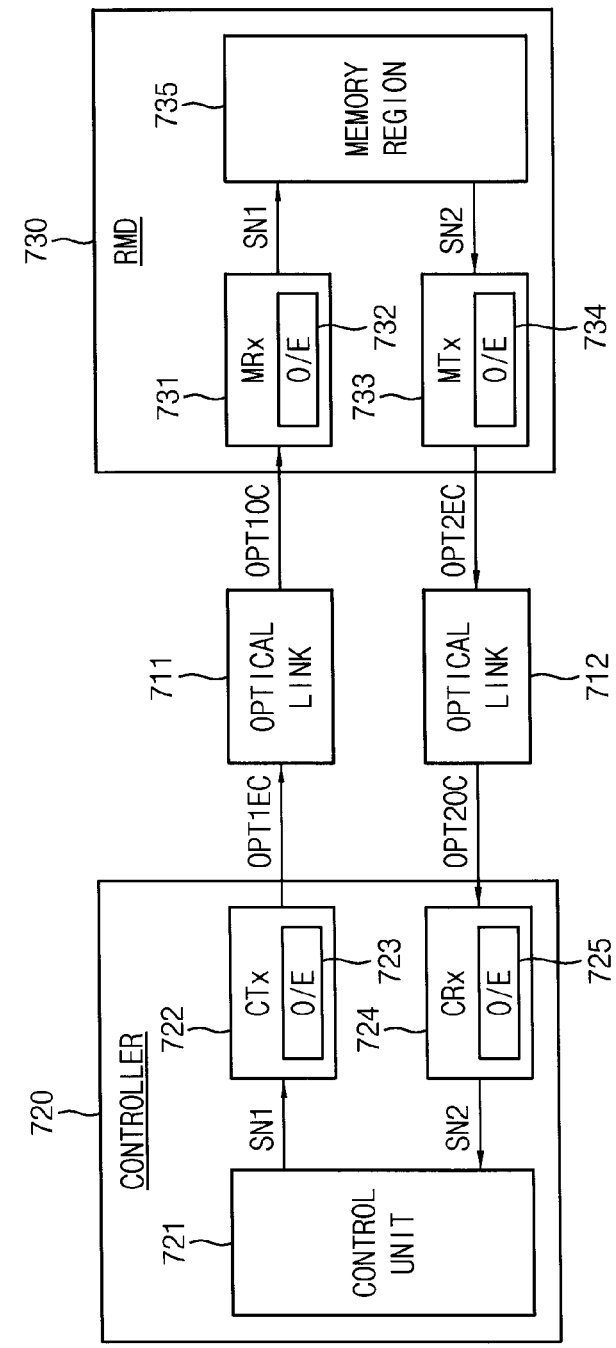

FIGS. 19 and 20 are block diagrams illustrating a memory system according to example embodiments.

Referring to FIG. 19, a memory system 700 includes a memory controller 701 and a resistive memory device 703.

The resistive memory device 703 is controlled by the memory controller 701. In other words, the memory controller 701 may transmit a command CMD and an address ADDR to the resistive memory device 703. The memory controller 701 may exchange data DQ with the resistive memory device 703. The memory controller 701 may input data to the resistive memory device 703 or may output data from the resistive memory device 703 based on requests from a host (not illustrated).

Referring to FIG. 20, a memory system 710 may include optical links 711 and 712, a controller 720 and a resistive memory device 730. The optical links 711 and 712 may interconnect the controller 720 and the resistive memory device 730.

The controller 720 may include a control unit 721, a first transmitter 722, and a first receiver 724. The control unit 721 may transmit a first electrical signal SN1 to the first transmitter 722. The first electrical signal SN1 may include commands, clock signals, addresses and/or write data to be transmitted to the resistive memory device 730.

The first transmitter 722 may include a first optical modulator 723. The first optical modulator 723 may convert the first electrical signal SN1 into a first optical transmission signal OTP1EC and may transmit the first optical transmission signal OTP1EC to the optical link 711. The first optical transmission signal OTP1EC may be transmitted by serial communication through the optical link 711. The first receiver 724 may include a first optical demodulator 725. The first optical demodulator 725 may convert a second optical reception signal OPT2OC received from the optical link 712 into a second electrical signal SN2 and may transmit the second electrical signal SN2 to the control unit 721.

The resistive memory device 730 may include a second receiver 731, a memory region 735 including STT-MRAM cells and a second transmitter 734. Also, the resistive memory device 730 may include an interface unit that provides various interface functions. The second receiver 731 may include a second optical demodulator 732. The second optical demodulator 732 may convert the first optical reception signal OPT1OC received from the optical link 711 into the first electrical signal SN1 and may transmit the first electrical signal SN1 to the memory region 735.

Write data may be stored into the memory region 735 in response to the first electrical signal SN1, or read data retrieved from the memory region 735 may be transmitted as the second electrical signal SN2 to the second transmitter 733. The second electrical signal SN2 may include clock signals and/or read data transmitted to the memory controller 720. The second transmitter 733 may include a second optical modulator 734. The second optical modulator 764 may convert the second electrical signal SN2 into the second optical data signal OPT2EC and may transmit the second optical data signal OPT2EC to the optical link 712. The second optical transmission signal OTP2EC may be transmitted by serial communication through the optical link 712.

Each of the resistive memory device 703 in FIG. 19 and the resistive memory device 730 in FIG. 20 may be one of the resistive memory device 100 of FIG. 1, the resistive memory device 100a of FIG. 5, the resistive memory device 100b of FIG. 6 and the resistive memory device 300 of FIG. 11 and may be implemented with one of the examples described above with reference to FIGS. 12, 13, 17 and 18. For example, the resistive memory device may include two bitline sense amplifiers that are connected to a first common node and have the substantially same structure. A pair of reference bitlines and a pair of reference resistive memory cells that store different reference data may be shared by two bitline sense amplifiers. Thus, the resistive memory device may efficiently generate sensing currents that have the substantially same amount without any additional circuit (e.g., a current mirror). Accordingly, the resistive memory device may have a relatively high integration degree and a relatively high data sensing performance.

Figure 21:
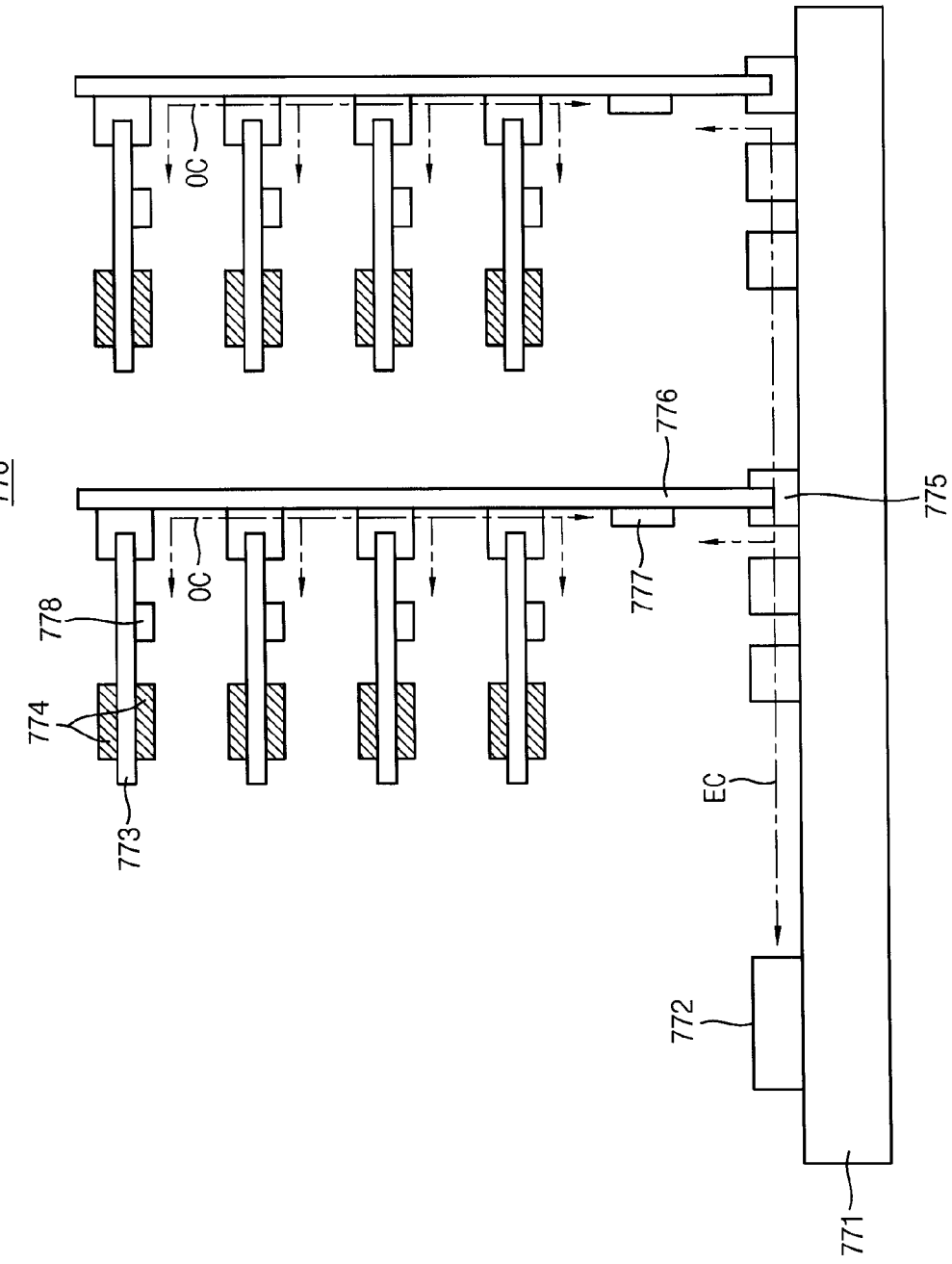
FIG. 21 is a diagram illustrating a server system including a resistive memory device according to example embodiments.

FIG. 21 is a diagram illustrating a server system including a resistive memory device according to example embodiments.

Referring to FIG. 21, a server system 770 may include a memory controller 772 and a plurality of memory modules 773. Each of the memory modules 773 may include a plurality of resistive memory devices 774.

Each of the resistive memory devices 774 may include two bitline sense amplifiers that are connected to a first common node and have the substantially same structure. A pair of reference bitlines and a pair of reference resistive memory cells that store different reference data may be shared by two bitline sense amplifiers. Thus, the resistive memory devices 774 may efficiently generate sensing currents that have the substantially same amount without any additional circuit (e.g., a current mirror). Accordingly, the resistive memory devices 774 may have a relatively high integration degree and a relatively high data sensing performance.

In the server system 770, each of second circuit boards 776 may be connected to each of sockets 775 on a first circuit board 771. The server system 770 may be designed to have a channel structure in which one second circuit board 776 is connected to the first circuit board 771 according to signal channels.

In the server system 770, signals may be transmitted to and/or from the memory modules 773 via optical I/O connections. To form the optical I/O connection, the server system 770 may further include an electric-to-optical conversion unit 777, and the memory modules 773 may further include an optical-to-electrical conversion unit 778.

The memory controller 772 may be connected to the electric-to-optical conversion unit 777 through an electrical channel EC. The electric-to-optical conversion unit 777 may convert an electrical signal received from the memory controller 772 through the electrical channel EC into an optical signal and may transmit the optical signal to an optical channel OC. Also, the electric-to-optical conversion unit 777 may convert an optical signal received through the optical channel OC into an electrical signal and may transmit the electrical signal to the electrical channel EC.

The memory module 773 may be connected to the electric-to-optical conversion unit 777 through the optical channel OC. An optical signal applied to the memory module 773 may be converted into an electrical signal through the optical-to-electric conversion unit 778 and may be transmitted to the resistive type memory chips 774. The server system 770 including the optical connection memory modules may support high storage capacity and a high processing speed.

Figure 22:
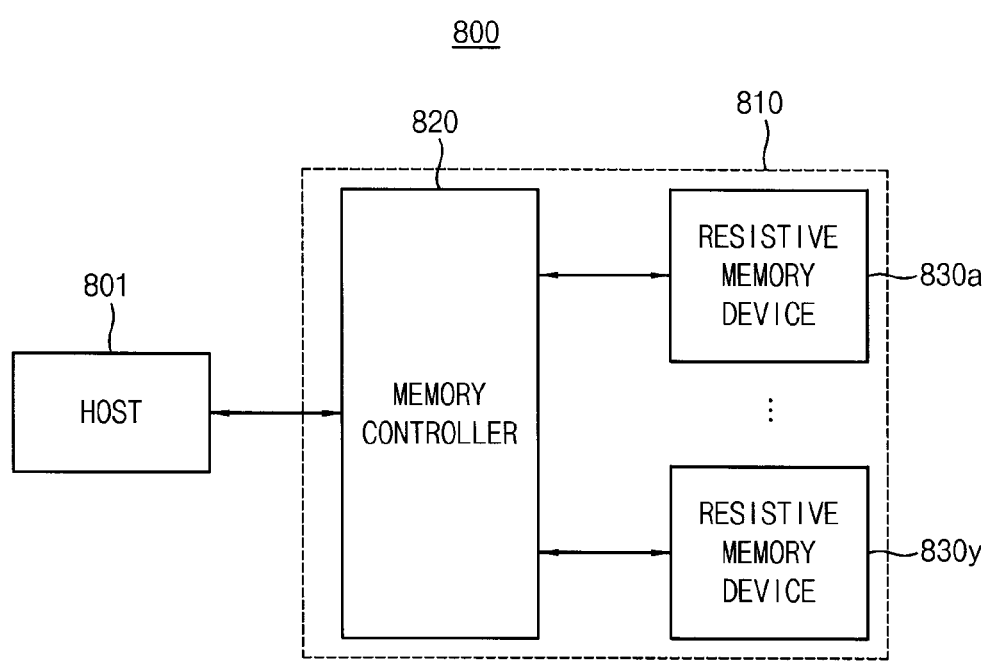
FIG. 22 is a block diagram illustrating an electronic system according to example embodiments.

FIG. 22 is a block diagram illustrating an electronic system according to example embodiments.

Referring to FIG. 22, an electronic system 800 may include a host 801 and a memory system 810. The memory system 810 may include a memory controller 820 and a plurality of resistive memory devices 830a, . . . , 830y.

The host 801 may communicate with the memory system 810 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 801 may also communicate with the memory system 810 through interface protocols such as Universal Serial Bus (USB), Multi-Media Card (MMC), Enhanced Small Disk Interface (ESDI), or Integrated Drive Electronics (IDE).

The memory controller 820 may control an overall operation of the memory system 810. The memory controller 820 may control an overall data exchange between the host 801 and the plurality of resistive memory devices 830a, . . . , 830y. For example, the memory controller 820 may write data in the plurality of resistive memory devices 830a, . . . , 830y or may read data from the plurality of resistive memory devices 830a, . . . , 830y in response to requests from the host 801.

In addition, the memory controller 100 may issue operation commands to the plurality of resistive memory devices 830a, . . . , 830y for controlling the plurality of resistive memory devices 830a, . . . , 830y.

Each of the resistive memory devices 830a, . . . , 830y may include two bitline sense amplifiers that are directly connected to a first common node and have the substantially same structure. A pair of reference bitlines and a pair of reference resistive memory cells that store different reference data may be shared by two bitline sense amplifiers. Thus, the resistive memory devices 830a, . . . , 830y may efficiently generate sensing currents that have the substantially same amount without any additional circuit (e.g., a current mirror). Accordingly, the resistive memory devices 830a, . . . , 830y may have a relatively high integration degree and a relatively high data sensing performance.

Figure 23:
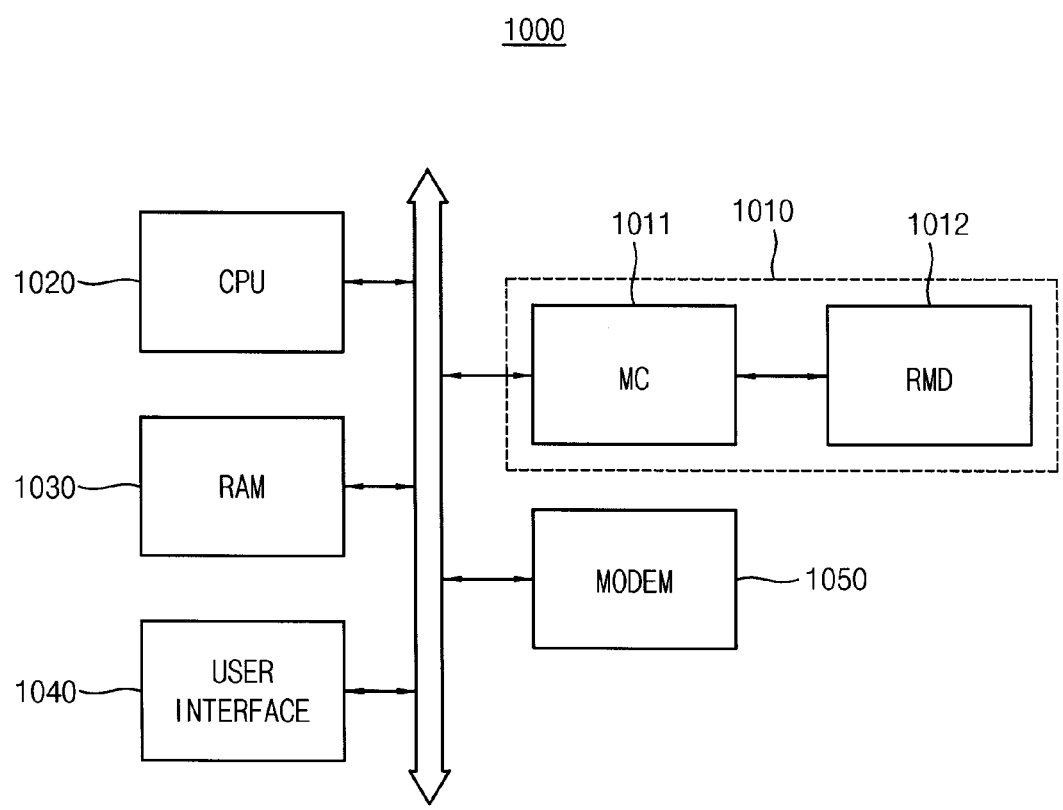
FIGS. 23 and 24 are block diagrams illustrating a computing system according to example embodiments.
Figure 24:
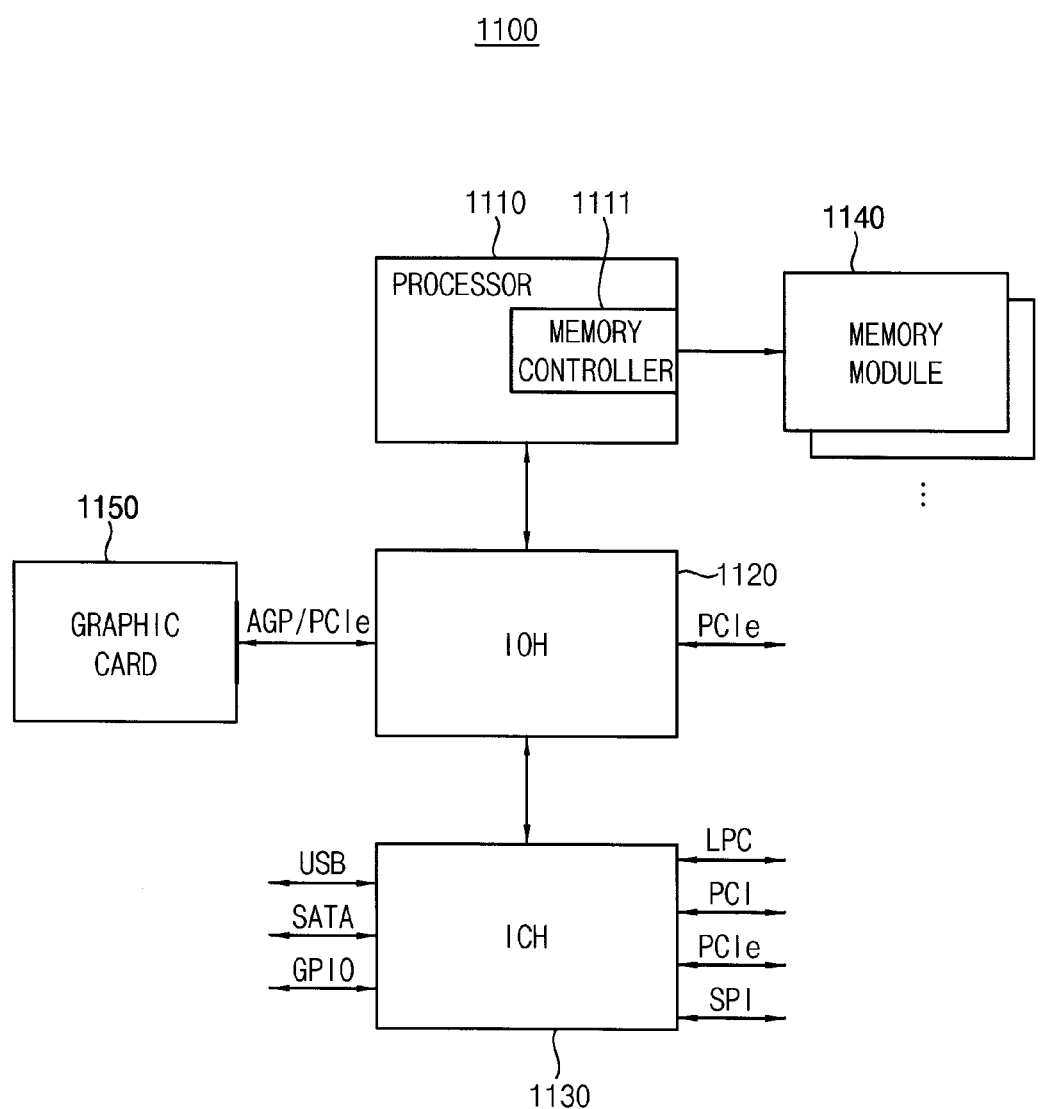

FIGS. 23 and 24 are block diagrams illustrating a computing system according to example embodiments.

Referring to FIG. 23, a computing system 1000 may include a memory system 1010, a central processing unit (CPU) 1020, a RAM 1030, a user interface 1040 and a modem 1050 such as a baseband chipset. The computing system 1000 may further include an application chipset, a camera image processor (CIS), and/or an I/O device.

The memory system 1010 may include a memory controller 1011 and a resistive memory device 1012. Data processed by the CPU 1020 or external data may be stored in the resistive memory device 1012. The resistive memory device 1012 may be the same as one of the resistive memory devices disclosed herein. The resistive memory device 1012 may include two bitline sense amplifiers that are directly connected to a first common node and have the substantially same structure. A pair of reference bitlines and a pair of reference resistive memory cells that store different reference data may be shared by two bitline sense amplifiers. Thus, the resistive memory device 1012 may efficiently generate sensing currents that have the substantially same amount without any additional circuit (e.g., a current mirror). Accordingly, the resistive memory device 1012 may have a relatively high integration degree and a relatively high data sensing performance.

The user interface 1040 may be an interface for transmitting data to a communication network or receiving data from the communication network. The user interface 1040 may have a wired or wireless form, and may include an antenna or a wired/wireless transceiver. Data applied through the user interface 1040 or the modem 1050 or processed by the CPU 1020 may be stored in the memory system 1010.

When the computing system 1000 is a device that performs wireless communications, the computing system 1000 may be used in a communication system such as code division multiple access (CDMA), global system for mobile communication (GSM), North American multiple access (NADC), or CDMA2000. The computing system 1000 may be mounted on an information processing device such as a personal digital assistant (PDA), a portable computer, a web tablet, a digital camera, a portable media player (PMP), a mobile phone, a wireless phone, or a laptop computer.

Referring to FIG. 24, a computing system 1100 may include a processor 1110, an input/output hub (IOH) 1120, an input/output controller hub (ICH) 1130, at least one memory module 1140 and a graphics card 1150. In some example embodiments, the computing system 1100 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 1110 may perform various computing functions, such as executing specific software for performing specific calculations or tasks. For example, the processor 1110 may be a microprocessor, a central process unit (CPU), a digital signal processor, or the like. In some example embodiments, the processor 1110 may include a single core or multiple cores. For example, the processor 1110 may be a multi-core processor, such as a dual-core processor, a quad-core processor, a hexa-core processor, etc. Although FIG. 24 illustrates the computing system 1100 including one processor 1110, in some example embodiments, the computing system 1100 may include a plurality of processors. The processor 1110 may include an internal or external cache memory.

The processor 1110 may include a memory controller 1111 for controlling operations of the memory module 1140. The memory controller 1111 included in the processor 1110 may be referred to as an integrated memory controller (IMC). A memory interface between the memory controller 1111 and the memory module 1140 may be implemented with a single channel including a plurality of signal lines, or may be implemented with multiple channels, to each of which at least one memory module 1140 may be coupled. In some example embodiments, the memory controller 1111 may be located inside the input/output hub 1120, which may be referred to as a memory controller hub (MCH).

The memory module 1140 may include a plurality of resistive memory devices that store data provided from the memory controller 1111. At least one of the plurality of resistive memory devices may be the same as one of the resistive memory devices disclosed herein. Each resistive memory device may include two bitline sense amplifiers that are directly connected to a first common node and have the substantially same structure. A pair of reference bitlines and a pair of reference resistive memory cells that store different reference data may be shared by two bitline sense amplifiers. Thus, the resistive memory devices may efficiently generate sensing currents that have the substantially same amount without any additional circuit (e.g., a current mirror). Accordingly, the resistive memory devices may have a relatively high integration degree and a relatively high data sensing performance.

The input/output hub 1120 may manage data transfer between the processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a Hyper-Transport, a lightning data transport (LDT), a QuickPath interconnect (QPI), a common system interface (CSI), etc. Although FIG. 24 illustrates the computing system 1100 including one input/output hub 1120, in some example embodiments, the computing system 1100 may include a plurality of input/output hubs. The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device (not shown) for displaying an image. The graphics card 1150 may include an internal processor for processing image data and an internal resistive type memory device. In some example embodiments, the input/output hub 1120 may include an internal graphics device along with or instead of the graphics card 1150 outside the input/output hub 1120. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration in order to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some example embodiments, the processor 1110, the input/output hub 1120 and the input/output controller hub 1130 may be implemented as separate chipsets or separate integrated circuits. In other example embodiments, at least two of the processor 1110, the input/output hub 1120 and the input/output controller hub 1130 may be implemented as a single chipset.

In an embodiment of the present inventive concept, a three-dimensional (3D) memory array may be provided in at least one of the resistive memory device 100 of FIG. 1, the resistive memory device 100a of FIG. 5, the resistive memory device 100b of FIG. 6, the resistive memory device 300 of FIG. 11, the resistive memory device 500 of FIG. 12, the resistive memory device 600 of FIG. 17, the resistive memory device 703 in FIG. 19, the resistive memory device 730 in FIG. 20, the resistive memory devices 774 in FIG. 21, the resistive memory devices 830a, . . . , 830y in FIG. 22, the resistive memory device 1012 in FIG. 23 and the resistive memory device included in the memory module 1140 in FIG. 24. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The present disclosure may be used in a resistive memory device or a system including the resistive memory device, such as a mobile phone, a smart phone, a personal digital assistants (PDA), a portable multimedia player (PMP), a digital camera, a digital television, a set-top box, a music player, a portable game console, a navigation device, a personal computer (PC), a server computer, a workstation, a tablet computer, a laptop computer, a smart card, a printer, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A resistive memory device comprising:
a first resistive memory cell connected to a first bitline;
a second resistive memory cell connected to a second bitline;
a reference current generator connected to a first common node, the reference current generator configured to provide a first reference current and a second reference current to the first common node, an amount of the second reference current being different from an amount of the first reference current;
a first bitline sense amplifier connected to the first common node and connected to the first bitline at, the first bitline sense amplifier configured to sense first data stored in the first resistive memory cell based on a first sensing current provided from the first common node, the first sensing current being generated based on the first and second reference currents; and
a second bitline sense amplifier connected to the first common node and connected to the second bitline, the second bitline sense amplifier configured to sense second data stored in the second resistive memory cell based on a second sensing current provided from the first common node, the second sensing current being generated based on the first and second reference currents,
wherein the sum of the first reference current and the second reference current is equal to the sum of the first sensing current and the second sensing current.

2. The resistive memory device of claim 1,
wherein an amount of the second sensing current is substantially the same as an amount of the first sensing current.

3. The resistive memory device of claim 2, wherein each of the amount of the first sensing current and the amount of the second sensing current is substantially the same as a half of an amount of the sum of the first reference current and the second reference current.

4. The resistive memory device of claim 3, wherein the first bitline sense amplifier includes:
a first sensing circuit connected to the first common node and a second node, the first sensing circuit configured to operate in response to a sensing enable signal; and
a second sensing circuit connected to the first common node and the second node, the second sensing circuit including a first output node and a second output node and configured to operate in response to an inverted signal of the sensing enable signal,
wherein a first result of sensing the first data is output at the first and second output nodes.

5. The resistive memory device of claim 4, further comprising:
a first column gating circuit configured to selectively connect the first output node to a first local input/output (I/O) line based on a first column selection signal; and
a second column gating circuit configured to selectively connect the second output node to a second local I/O line based on the first column selection signal.

6. The resistive memory device of claim 1, wherein the reference current generator includes:
a first reference resistive memory cell connected to a first reference bitline, the first reference resistive memory cell configured to store first reference data having a first logic level; and a second reference resistive memory cell connected to a second reference bitline, the second reference resistive memory cell configured to store second reference data having a second logic level different from the first logic level, and wherein each of the first and second reference bitlines is connected to the first common node.

7. The resistive memory device of claim 6,
wherein the first reference bitline and the first reference resistive memory cell are substantially symmetric to the first bitline and the first resistive memory cell with respect to the first bitline sense amplifier, and
wherein the second reference bitline and the second reference resistive memory cell are substantially symmetric to the second bitline and the second resistive memory cell with respect to the second bitline sense amplifier.

8. The resistive memory device of claim 1, further comprising:
a third resistive memory cell connected to a third bitline, and storing third data;
a fourth resistive memory cell connected to a fourth bitline, and storing fourth data;
a first bitline selector configured to selectively connect a second node to one of the first and third bitlines based on a bitline selection signal; and
a second bitline selector configured to selectively connect a third node to one of the second and fourth bitlines based on the bitline selection signal,
wherein the first bitline sense amplifier is configured to sense the selected data of the first data and third data through the selected bitline of the first and third bitlines based on the first sensing current, and
wherein the second bitline sense amplifier is configured to sense the selected data of the second data and fourth data through the selected bitline of the second and fourth bitlines based on the second sensing current.

9. The resistive memory device of claim 1, wherein the first data and the second data are substantially simultaneously sensed.

10. The resistive memory device of claim 1, further comprising:
a first bitline connector configured to selectively connect the first bitline to a second node based on a read column selection signal; and
a first precharge circuit configured to precharge the first bitline to a source line voltage based on a precharge control signal.

11. The resistive memory device of claim 1, wherein the first resistive memory cell includes:
a first resistive element having a first terminal connected to the first bitline and a second terminal; and
a first cell transistor having a first electrode connected to the second terminal of the first resistive element, a gate electrode connected to a first wordline, and a second electrode connected to a source line voltage.

12. The resistive memory device of claim 11, wherein the first resistive element includes a magnetic tunnel junction (MTJ) element.

13. The resistive memory device of claim 1, further comprising:
a row decoder configured to select the first and second resistive memory cells based on a row address;
a column decoder configured to select the first and second resistive memory cells based on a column address; and
a source line voltage generator configured to provide a source line voltage to the first and second resistive memory cells.

14. A resistive memory device comprising:
a memory cell array including a plurality of sub array blocks and a plurality of bitline sense amplifier blocks disposed adjacent to the plurality of sub array blocks,
wherein a respective one of the sub array blocks includes:
a first resistive memory cell connected to a first bitline;
a second resistive memory cell connected to a second bitline;
a reference current generator connected to a first common node, the reference current generator configured to generate a first reference current and a second reference current, and to apply the first and second reference currents to the first common node, an amount of the second reference current being different from an amount of the first reference current, and
wherein a respective one of the bitline sense amplifier blocks includes:
a first bitline sense amplifier connected to the first common node and connected to the first bitline at a second node, the first bitline sense amplifier configured to sense first data stored in the first resistive memory cell based on a first sensing current provided from the first common node, the first sensing current being generated based on the first and second reference currents; and
a second bitline sense amplifier connected to the first common node and connected to the second bitline at a third node, the second bitline sense amplifier configured to sense second data stored in the second resistive memory cell based on a second sensing current provided from the first common node, the second sensing current being generated based on the first and second reference currents,
wherein a total reference current of the first reference current and the second reference current provided to the first common node is divided into the first sensing current and the second sensing current by the first common node.

15. The resistive memory device of claim 14,
wherein each of the amount of the first sensing current and the amount of the second sensing current is substantially the same as a half of an amount of the total reference current.

16. The resistive memory device of claim 14, wherein the resistive memory device includes at least one selected from a magnetic random access memory (MRAM), a resistive random access memory (RRAM), a phase change random access memory (PRAM) and a ferroelectric random access memory (FRAM).

17. The resistive memory device of claim 14, wherein each of the first resistive memory cell and the second resistive memory cell includes a spin-transfer torque magneto-resistive random access memory (STT-MRAM) cell that includes a magnetic tunnel junction (MTJ) element and a cell transistor.

18. A method of performing a read operation for a resistive memory device including a first resistive memory cell connected to a first bitline sense amplifier and a second resistive memory cell connected to a second bitline sense amplifier, the method comprising:
generating a first reference current based on a first reference resistive memory cell;
generating a second reference current based on a second reference resistive memory cell;

summing the first reference current and the second reference current into a total reference current and dividing the total reference current into a first sensing current and a second sensing current;

providing a first sensing current and a second sensing current to a first bitline sense amplifier and a second bitline sense amplifier, respectively; and substantially simultaneously sensing first data of the first resistive memory cell and second data of the second resistive memory cell based on the first and second sensing currents, respectively.

19. The method of claim 18, wherein an amount of the second reference current is different from an amount of the first reference current, and wherein an amount of the second sensing current is substantially the same as an amount of the first sensing current.

20. The method of claim 18, wherein substantially simultaneously sensing the first and second data includes:

precharging a first bitline and a second bitline to a source line voltage based on a precharge control signal, the first bitline being connected to the first resistive memory cell, the second bitline being connected to the second resistive memory cell;

selecting the first and second resistive memory cells by enabling a first wordline connected to the first and second resistive memory cells;

providing the first and second sensing currents to the first and second bitline sense amplifiers based on a read column selection signal;

sensing, by the first bitline sense amplifier, the first data based on a sensing enable signal and the first sensing current to output a first result of sensing the first data; and sensing, by the second bitline sense amplifier, the second data based on the sensing enable signal and the second sensing current to output a second result of sensing the second data, the first result and the second result being substantially simultaneously output.

* * * * *